United States Patent
Jo et al.

(10) Patent No.: US 12,125,543 B2
(45) Date of Patent: Oct. 22, 2024

(54) SEMICONDUCTOR MEMORY DEVICE AND METHOD OF OPERATING THE SAME

(71) Applicant: SK hynix Inc., Icheon-si (KR)

(72) Inventors: Eun Woo Jo, Icheon-si (KR); Jong Woo Kim, Icheon-si (KR)

(73) Assignee: SK hynix Inc., Icheon (KR)

( * ) Notice: Subject to any disclaimer, the term of this patent is extended or adjusted under 35 U.S.C. 154(b) by 119 days.

(21) Appl. No.: 18/073,276

(22) Filed: Dec. 1, 2022

(65) Prior Publication Data
US 2023/0395163 A1 Dec. 7, 2023

(30) Foreign Application Priority Data
Jun. 3, 2022 (KR) .................. 10-2022-0068155

(51) Int. Cl.
 *G11C 16/26* (2006.01)
 *G11C 16/08* (2006.01)
 *G11C 16/34* (2006.01)
 *G11C 16/04* (2006.01)

(52) U.S. Cl.
 CPC .............. *G11C 16/26* (2013.01); *G11C 16/08* (2013.01); *G11C 16/3459* (2013.01); *G11C 16/0483* (2013.01)

(58) Field of Classification Search
 None
 See application file for complete search history.

(56) References Cited

U.S. PATENT DOCUMENTS

2015/0117114 A1* 4/2015 Wan .................. G11C 11/5642
 365/185.21

FOREIGN PATENT DOCUMENTS

KR 1020150033129 A 4/2015
KR 1020190130263 A 11/2019

* cited by examiner

*Primary Examiner* — Tan T. Nguyen
(74) *Attorney, Agent, or Firm* — William Park & Associates Ltd.

(57) ABSTRACT

A semiconductor memory device includes a memory cell array including memory cells, a peripheral circuit performing a read/verify operation of selected memory cells, and a control logic circuit controlling the read/verify operation of the peripheral circuit. The control logic circuit controls the peripheral circuit to apply a first voltage to a selected word line connected to the selected memory cells, float unselected word lines adjacent to the selected word line among unselected word lines, apply a first under-drive voltage lower than the first voltage to the selected word line during at least a partial period in which the unselected word lines adjacent to the selected word line are floated, and apply a second voltage higher than the first under-drive voltage and lower than the first voltage to the selected word line.

21 Claims, 16 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0068155, filed on Jun. 3, 2022, in the Korean Intellectual Property Office, the entire disclosure of which is incorporated herein by reference.

BACKGROUND

1. Technical Field

The present disclosure relates to a semiconductor memory device, and more particularly, to a semiconductor memory device having an improved read speed and a method of operating the same.

2. Related Art

A semiconductor memory device may be formed as a two-dimensional structure in which strings are horizontally arranged on a semiconductor substrate, or as a three-dimensional structure in which the strings are vertically stacked on the semiconductor substrate. A three-dimensional memory device is a memory device designed to resolve a limit of an integration degree of a two-dimensional memory device, and may include a plurality of memory cells that are vertically stacked on a semiconductor substrate.

SUMMARY

An embodiment of the present disclosure is directed to a semiconductor memory device having an improved read speed and a method of operating the same.

According to an embodiment of the present disclosure, a semiconductor memory device includes a memory cell array, a peripheral circuit, and a control logic circuit. The memory cell array includes a plurality of memory cells. The peripheral circuit is configured to perform a read operation and/or a verify operation on selected memory cells among the plurality of memory cells. The control logic circuit is configured to control the read operation and/or the verify operation of the peripheral circuit. The control logic circuit is configured to control the peripheral circuit to apply a first voltage to a selected word line connected to the selected memory cells, float unselected word lines adjacent to the selected word line among unselected word lines not including the selected word line, apply a first under-drive voltage lower than the first voltage to the selected word line during at least a partial period during which the unselected word lines adjacent to the selected word line are floated, and apply a second voltage higher than the first under-drive voltage and lower than the first voltage to the selected word line.

According to another embodiment of the present disclosure, a read operation and/or a verify operation on a plurality of memory cells is performed by a method of operating a semiconductor memory device. The method of operating the semiconductor memory device includes applying a first voltage to a selected word line connected to the selected memory cells and applying a read pass voltage to unselected word lines except for the selected word line, floating unselected word lines adjacent to the selected word line among the unselected word lines, and applying a first under-drive voltage lower than the first voltage to the selected word line during at least a partial period during which the unselected word lines adjacent to the selected word line are floated.

According to still another embodiment of the present disclosure, a read operation and/or a verify operation on a plurality of memory cells is performed by a method of operating a semiconductor memory device. The method of operating the semiconductor memory device includes applying a first voltage to a selected word line, applying a first read pass voltage to unselected word lines that are not adjacent to the selected word line, and applying a second read pass voltage greater than the first read pass voltage to unselected word lines adjacent to the selected word line, floating the unselected word lines adjacent to the selected word line among the unselected word lines, and applying a first under-drive voltage lower than the first voltage to the selected word line during at least a partial period during which the unselected word lines adjacent to the selected word line are floated.

The present technology may provide a semiconductor memory device having an improved read speed and a method of operating the same.

DETAILED DESCRIPTION

Specific structural or functional descriptions of embodiments according to the concepts which are disclosed in the present specification or application are illustrated only to describe the embodiments according to the concepts of the present disclosure, and the embodiments according to the concepts of the present disclosure may be implemented in various forms and should not be construed as being limited to the embodiments described in the present specification or application.

Figure 1:
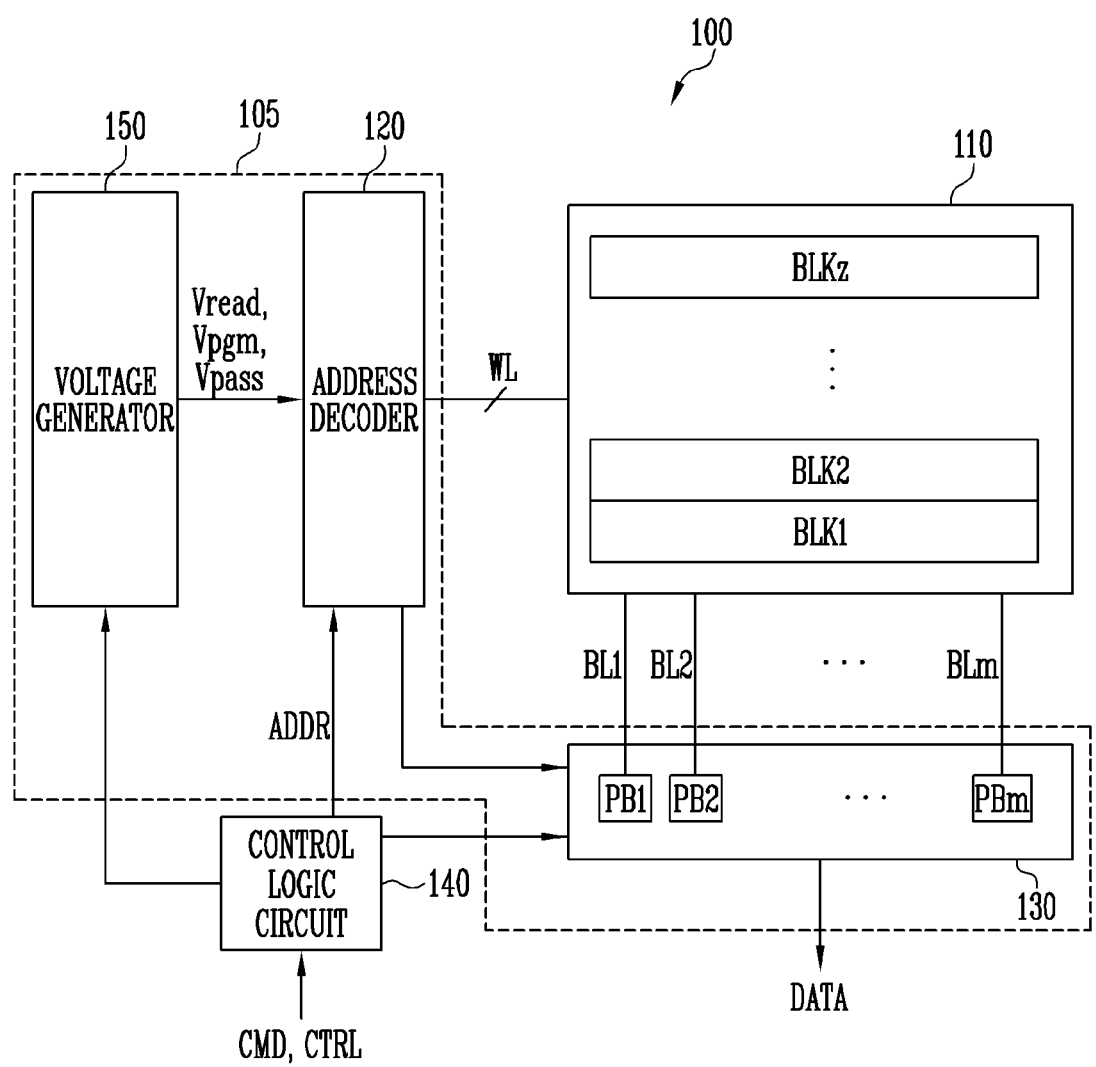
FIG. 1 is a block diagram illustrating a semiconductor memory device according to an embodiment of the present disclosure.

FIG. 1 is a block diagram illustrating a semiconductor memory device 100 according to an embodiment of the present disclosure.

Referring to FIG. 1, the semiconductor memory device 100 includes a memory cell array 110, an address decoder 120, a read and write circuit 130, a control logic circuit 140, and a voltage generator 150.

The memory cell array 110 includes a plurality of memory blocks BLK1 to BLKz. The plurality of memory blocks BLK1 to BLKz are connected to the address decoder 120 through word lines. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure.

Each of the plurality of memory cells included in the memory cell array 110 may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, the plurality of memory cells included in the memory cell array 110 may include a plurality of memory cells each storing three or more bits of data.

The address decoder 120, the read and write circuit 130, and the voltage generator 150 operate as a peripheral circuit 105 that drives the memory cell array 110. The address decoder 120 is connected to the memory cell array 110 through the word lines WL. The address decoder 120 is configured to operate in response to control of the control logic circuit 140. The address decoder 120 receives an address ADDR. The address ADDR may include a block address, a column address, a row address, or the like.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during a read operation, and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change in an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic circuit 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic circuit 140 is connected to the address decoder 120, the read and write circuit 130, and the voltage generator 150. The control logic circuit 140 receives a command CMD and a control signal CTRL through the input/output buffer (not shown) of the semiconductor memory device 100. The control logic circuit 140 is configured to control overall operations of the semiconductor memory device 100 in response to the control signal CTRL. In addition, the control logic circuit 140 outputs a control signal for adjusting a sensing node pre-charge potential level of the plurality of page buffers PB1 to PBm. The control logic circuit 140 may control the read and write circuit 130 to perform the read operation of the memory cell array 110. Meanwhile, the control logic circuit 140 may determine operation voltages applied to the word lines WL of the memory cell array 110 during the read operation and/or the verify operation. In an embodiment, the control logic circuit 140 may control the peripheral circuit 105 to apply an over-drive voltage or an under-drive voltage to the selected word line during the read operation. The over-drive voltage is a voltage higher than the read voltage or the verify voltage applied to the selected word line, and is a voltage for quickly increasing a voltage of the selected word line to the read voltage or the verify voltage. The under-drive voltage is a voltage lower than the read voltage or the verify voltage applied to the selected word line, and is a voltage for quickly decreasing the voltage of the selected word line to the read voltage or the verify voltage.

Meanwhile, according to an embodiment of the present disclosure, when the under-drive voltage or the over-drive voltage is applied to the selected word line, the control logic circuit 140 may control the peripheral circuit 105 to float the unselected word lines positioned adjacent to the selected word line. A settling time required for increasing or decreasing the voltage of the selected word line may be reduced, by floating the unselected word lines positioned adjacent to the selected word line. As a result, a read speed or a verify speed of the semiconductor memory device 100 is improved.

Figure 2:
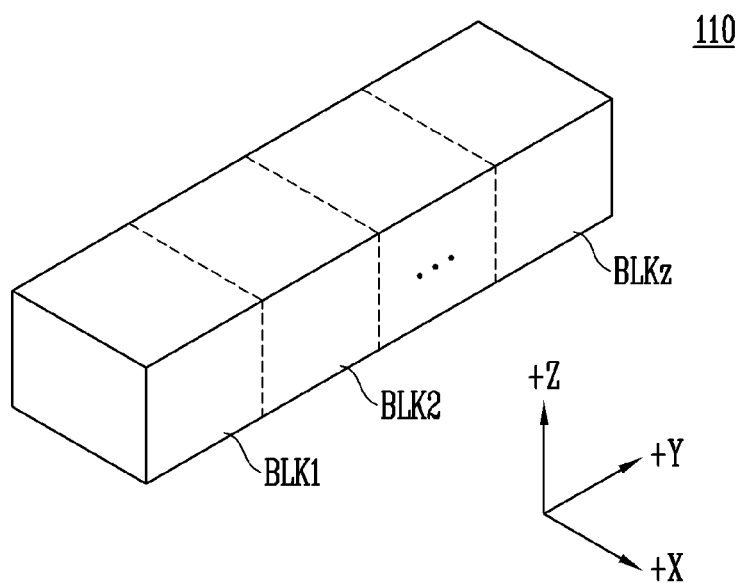
FIG. 2 is an isometric diagram illustrating an embodiment of a memory cell array of FIG. 1.

FIG. 2 is an isometric diagram illustrating an embodiment of the memory cell array 110 of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. The plurality of memory cells are arranged along a +X direction, a +Y direction, and a +Z direction. A structure of each memory block is described in more detail with reference to FIG. 3.

Figure 3:
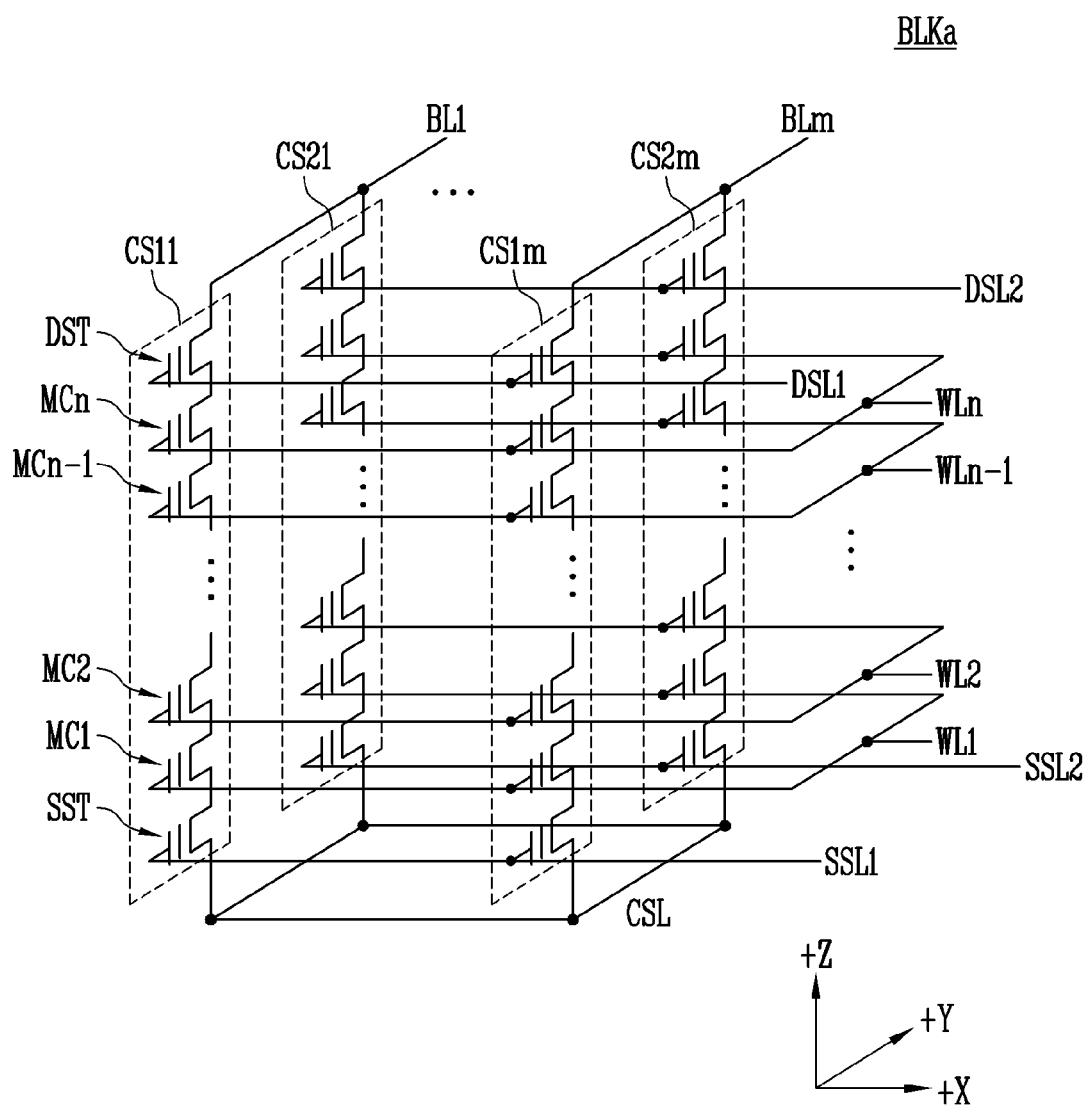
FIG. 3 is a circuit diagram illustrating any one memory block BLKa among memory blocks BLK1 to BLKz of FIG. 2.

FIG. 3 is a circuit diagram illustrating any one memory block BLKa among the memory blocks BLK1 to BLKz of FIG. 2.

Referring to FIG. 3, the memory block BLKa includes a plurality of cell strings CS11 to CS1*m* and CS21 to CS2*m*. In the memory block BLKa, m cell strings are arranged in a row direction (that is, the +X direction). In FIG. 3, two cell strings are arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCn.

Figure 4:
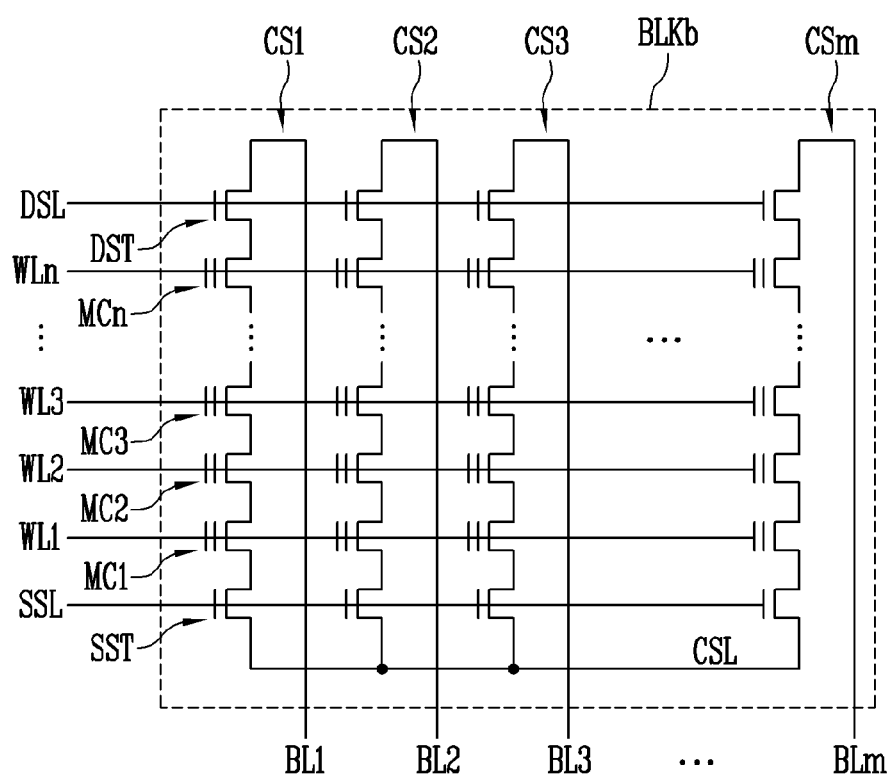
FIG. 4 is a circuit diagram illustrating an embodiment of any one memory block BLKb among the plurality of memory blocks BLK1 to BLKz included in the memory cell array 110 of FIG. 1.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1*m* of a first row are connected to a first source select line SSL1. The source select transistors of the cell strings CS21 to CS2*m* of a second row are connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

Gates of the first to n-th memory cells MC1 to MCn of each cell string are connected to first to n-th word lines WL1 to WLn, respectively.

The drain select transistor DST of each cell string is connected between a corresponding bit line and the memory cells MC1 to MCn. The drain select transistors DST of the cell string arranged in the row direction are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1*m* and CS2*m* of the m-th column are connected to the m-th bit line BL*m*.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BL*m*. In addition, even-numbered cell strings among the cell strings CS11 to CS1*m* or CS21 to SC2*m* arranged in the row direction may be connected to the even bit lines, and odd-numbered cell strings among the cell strings CS11 to CS1*m* or CS21 to CS2*m* arranged in the row direction may be connected to odd bit lines, respectively.

In an embodiment, at least one of the first to n-th memory cells MC1 to MCn may be used as a dummy memory cell. For example, at least one or more dummy memory cells are provided to reduce an electric field between the source select transistor SST and the memory cells MC1 to MCn. Alternatively, at least one or more dummy memory cells are provided to reduce an electric field between the drain select transistor DST and the memory cells MC1 to MCn. As more dummy memory cells are provided, reliability of an operation for the memory block BLKa is improved, however, a size, that is a physical dimension, of the memory block BLKa increases. As less dummy memory cells are provided, the size, that is, the physical dimension, of the memory block BLKa may be reduced, however, the reliability of the operation for the memory block BLKa may also be reduced.

Referring to FIG. 3, each of the plurality of cell strings CS11 to CS1*m* and CS21 to CS2*m* may be formed in an 'I' shape between the bit lines BL1 to BL*m* and the common source line CSL. However, this is an example, and another type of memory block is also possible. For example, each of the plurality of cell strings included in the memory block may be formed in a 'U' shape. In this case, each cell string may include a pipe transistor. In addition, memory cells of a first group among the memory cells included in each cell string may be connected in series between the source select transistor and the pipe transistor. That is, the memory cells of the first group and memory cells of a second group may be connected through the pipe transistor. Meanwhile, the memory cells of the second group among the memory cells included in each cell string may be connected in series between the pipe transistor and the drain select transistor. A gate of the pipe transistor of each cell string may be connected to a pipe line.

FIG. 4 is a circuit diagram illustrating an embodiment of any one memory block BLKb among the plurality of memory blocks BLK1 to BLKz included in the memory cell array 110 of FIG. 1.

Referring to FIG. 4, the memory block BLKb includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between the common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 5:
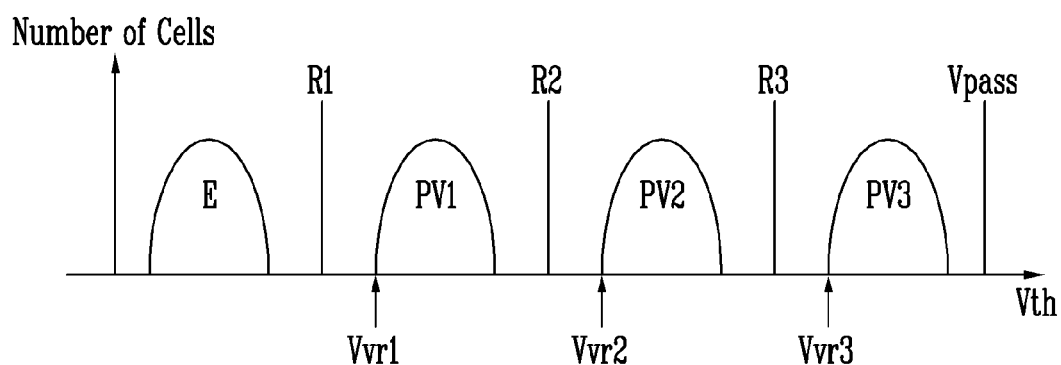
FIG. 5 is a graph illustrating a threshold voltage distribution of a multi-level cell.

FIG. 5 is a graph illustrating a threshold voltage distribution of a multi-level cell.

Referring to FIG. 5, a threshold voltage of a multi-level cell (MLC) may be included in any one of an erase state E, a first program state PV1, a second program state PV2, and a third program state PV3. The semiconductor memory device and a method of operating the same according to the present disclosure might not be applied only to the MLC, but also to a triple-level cell (TLC), a quad-level cell (QLC), or a memory cell storing five or more bits of data. However, for convenience of discussion, the following description is based on the MLC.

During the read operation, a first read voltage R1 may be applied to the selected word line to distinguish the erase state E and the first program state PV1. In addition, a second read voltage R2 may be applied to the selected word line to distinguish the first program state PV1 and the second program state PV2. Meanwhile, a third read voltage R3 may be applied to the selected word line to distinguish the second program state PV2 and the third program state PV3. During the read operation, a read pass voltage Vpass may be applied to the unselected word lines.

Meanwhile, in the verify operation performed during the program operation, a first verify voltage Vvr1 may be used for a verify operation for the first program state PV1. In addition, a second verify voltage Vvr2 may be used for a verify operation for the second program state PV2. Meanwhile, a third verify voltage Vvr3 may be used for a verify operation for the third program state PV3. The verify operation on the selected memory cells included in the semiconductor memory device may be performed in a method similar to that of the read operation on the selected memory cells. The semiconductor memory device and the method of operating the same according to an embodiment of the present disclosure may be used for both of the read operation and the verify operation on the selected memory cells. However, for convenience of discussion, the present disclosure is described below based on the read operation on the selected memory cells. However, the present disclosure is not limited thereto, and may also be applied to the verify operation on the selected memory cells.

Figure 6:
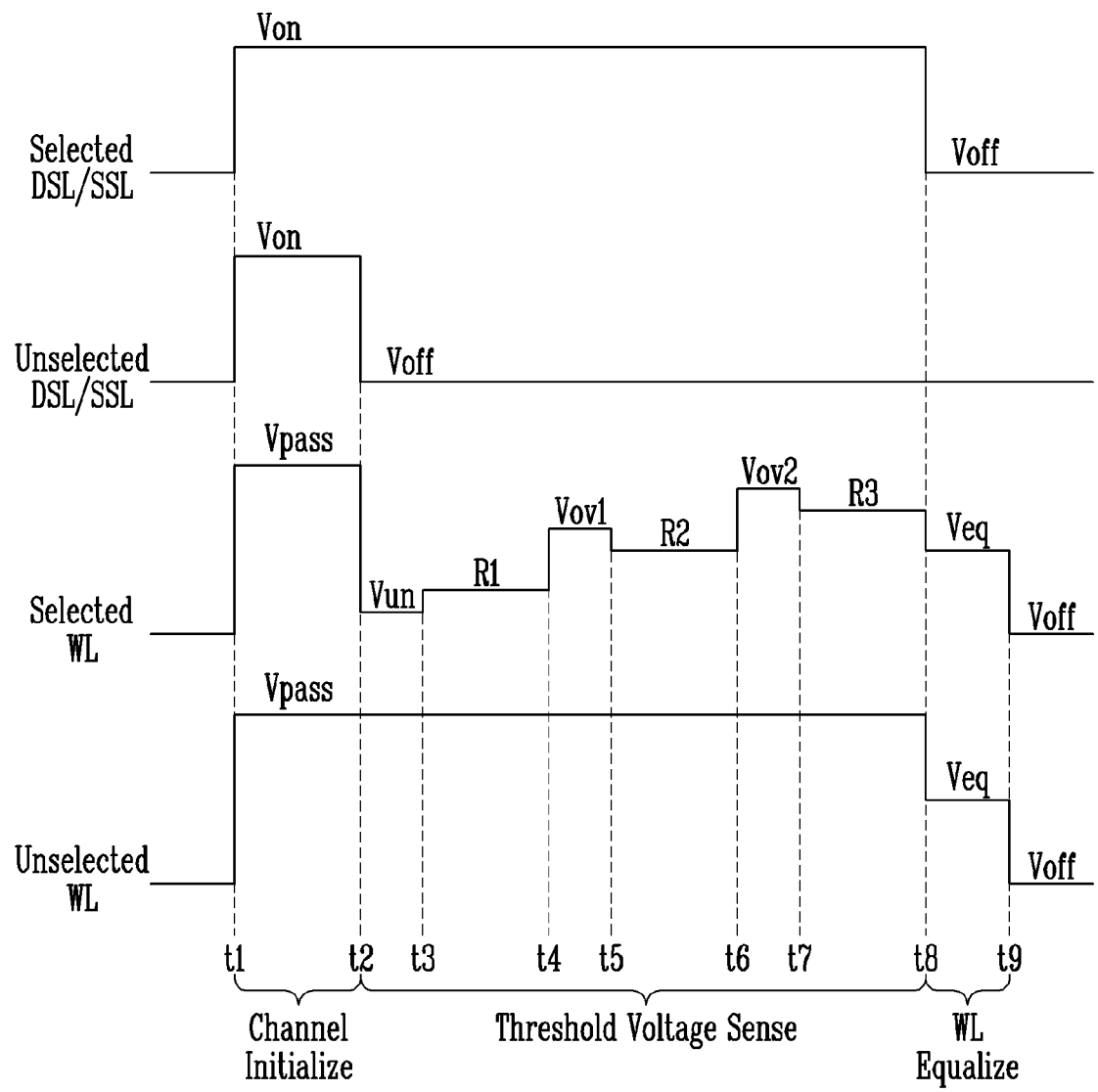
FIG. 6 is a timing diagram illustrating a method of operating a semiconductor memory device according to an embodiment of the present disclosure.

FIG. 6 is a timing diagram illustrating a method of operating a semiconductor memory device according to an embodiment of the present disclosure.

Referring to FIG. 6, the read operation on the selected memory cells may be performed by a method of operating a semiconductor memory device according to an embodiment of the present disclosure. The read operation of the selected memory cells may include a channel initialization step, a threshold voltage sensing step of the selected memory cells, and a word line equalize step. In FIG. 6, the channel initialization step is performed during a period t1 to t2, the threshold voltage sensing step is performed during a period t2 to t8, and the word line equalize step is performed during a period t8 to t9.

At a time t1, a turn-on voltage Von is applied to selected drain select line and source select line, and the turn-on voltage Von is also applied to unselected drain select line and source select line. Meanwhile, the read pass voltage Vpass is applied to the selected word line connected to memory cells to be read, and the read pass voltage is also applied to the unselected word lines. In a state in which the turn-on voltage Von is applied to the drain select lines and the source select lines, the read pass voltage Vpass is applied to all word lines, and thus a channel initialization operation may be performed.

At a time t2, a turn-off voltage Voff is applied to the unselected drain select line and source select line. The turn-off voltage Voff may be a voltage capable of turning off the drain select transistor and the source select transistor, and in an embodiment, the turn-off voltage Voff may be a ground voltage. As shown in FIG. 3, when two cell strings are arranged in the column direction (that is, the +Y direction), a drain select line and a source select line connected to cell strings including the memory cells to be read become the selected drain select line and source select line, respectively. Meanwhile, a drain select line and a source select line connected to cell strings which do not include the memory cells to be read become the unselected drain select line and source select line, respectively. Meanwhile, the turn-on voltage Von is continuously applied to the selected drain select line and source select line.

At the time t2, an under-drive voltage Vun may be applied to the selected word line. The under-drive voltage Vun may be used to quickly decrease the voltage of the selected word line from the read pass voltage Vpass. Therefore, the under-drive voltage Vun is determined to be lower than a first read voltage R1 applied thereafter. Meanwhile, the read pass voltage Vpass is continuously applied to the unselected word lines.

At a time t3, the first read voltage R1 is applied to the selected word line. Prior to this, because the under-drive voltage Vun is applied to the selected word line during a period t2 to t3, the voltage of the selected word line may be quickly decreased from the read pass voltage Vpass to the first read voltage R1. During a period t3 to t4, it is determined whether a threshold voltage of the selected memory cells is greater than the first read voltage.

At a time t4, a first over-drive voltage Vov1 is applied to the selected word line. The first over-drive voltage Vov1 may be used to quickly increase the voltage of the selected word line from the first read voltage R1. Therefore, the first over-drive voltage Vov1 is determined to be higher than a second read voltage R2 applied thereafter.

At a time t5, the second read voltage R2 is applied to the selected word line. Prior to this, because the first over-drive voltage Vov1 is applied to the selected word line during a period t4 to t5, the voltage of the selected word line may be quickly increased from the first read voltage R1 to the second read voltage R2. During a period t5 to t6, it is determined whether the threshold voltage of the selected memory cells is greater than the second read voltage.

At a time t6, a second over-drive voltage Vov2 is applied to the selected word line. The second over-drive voltage Vov2 may be used to quickly increase the voltage of the selected word line from the second read voltage R2. Therefore, the second over drive-voltage Vov2 is determined to be higher than a third read voltage R3 applied thereafter.

At a time t7, the third read voltage R3 is applied to the selected word line. Prior to this, because the second over-drive voltage Vov2 is applied to the selected word line during a period t6 to t7, the voltage of the selected word line may be quickly increased from the second read voltage R2 to the third read voltage R3. During a period t7 to t8, it is determined whether the threshold voltage of the selected memory cells is greater than the third read voltage.

At a time t8, the turn-off voltage Voff may be applied to the selected drain select line DSL and source select line SSL. Meanwhile, at the time t8, an equalizing voltage Veq is applied to the selected word line and the unselected word line. Through this, an equalization operation on the word lines is performed.

At a time t9, the turn-off voltage Voff is applied to the word lines. The read operation may be ended after the time t9.

Referring to FIG. 6, the first read voltage R1 is applied to the selected word line during the period t3 to t4, the second read voltage R2 is applied to the selected word line during the period t5 to t6, and the third read voltage R3 is applied to the selected word line during the period t7 to t8. That is, read voltages are sequentially applied from a lowest read voltage R1 to a highest read voltage R3 according to sizes of the read voltages. In this case, a difference between the read pass voltage Vpass applied to the selected word line during the period t1 to t2 and the first read voltage R1 applied to the selected word line during the period t3 to t4 is relatively large. Therefore, a settling time in which the voltage of the selected word line is decreased from the read pass voltage Vpass to the first read voltage R1 is relatively long despite a use of the under-drive voltage Vun. This causes a read speed of the selected memory cells to be reduced.

Figure 7:
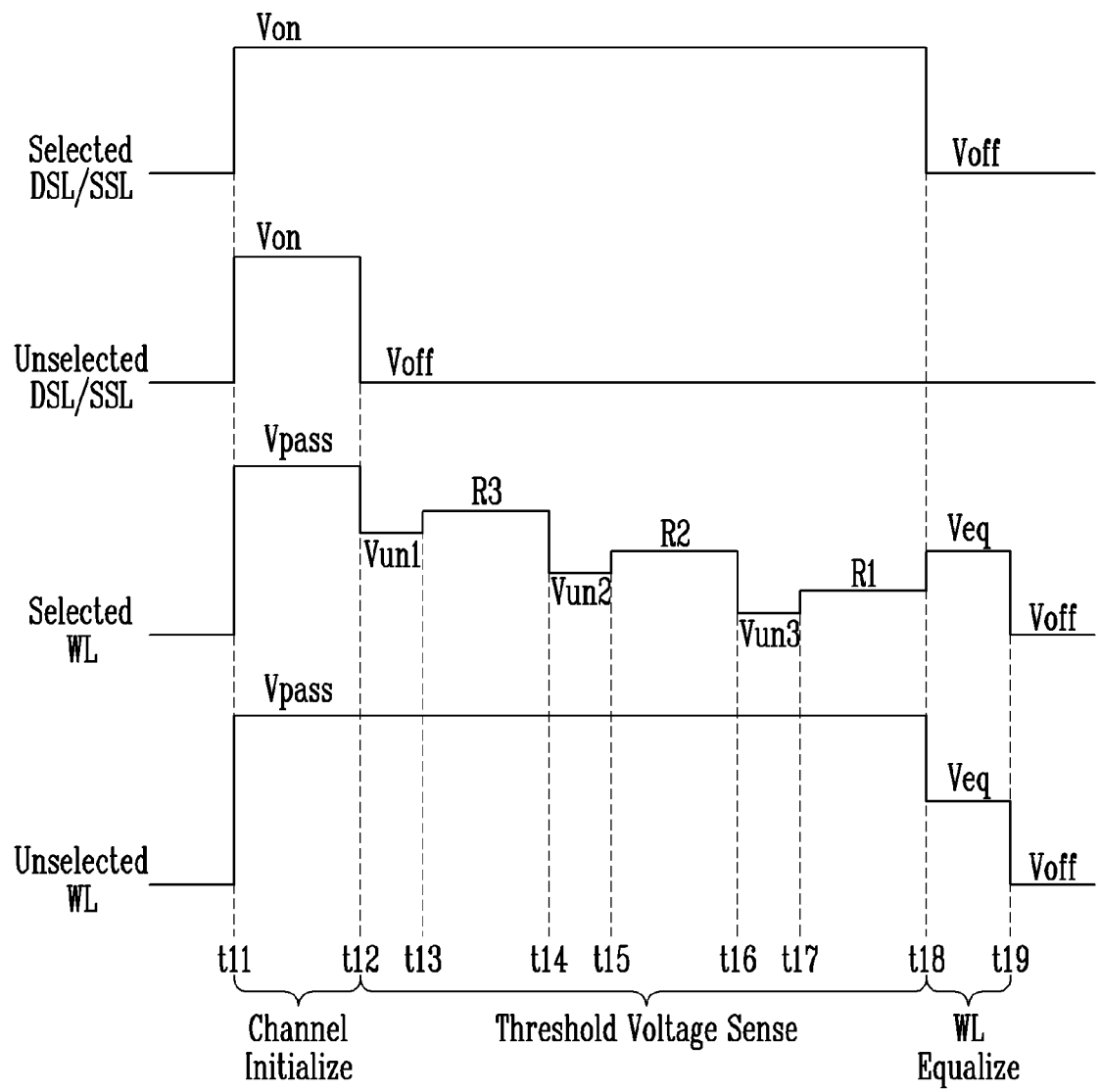
FIG. 7 is a timing diagram illustrating a method of operating a semiconductor memory device according to another embodiment of the present disclosure.

FIG. 7 is a timing diagram illustrating a method of operating a semiconductor memory device according to another embodiment of the present disclosure. Referring to FIG. 7, the read operation is performed in a method similar to the operation method shown in FIG. 6, except that read voltages are applied to the selected word line from the highest read voltage R3 to the lowest read voltage R1. Therefore, an overlapping description is omitted.

In FIG. 7, the channel initialization step is performed during a period t11 to t12, the threshold voltage sensing step is performed during a period t12 to t18, and the word line equalize step is performed during a period t18 to t19.

At a time t11, the turn-on voltage Von is applied to the selected drain select line and source select line, and the turn-on voltage Von is also applied to the unselected drain select line and source select line. Meanwhile, the read pass voltage Vpass is applied to the selected word line connected to the memory cells to be read, and the read pass voltage is also applied to the unselected word lines.

At a time t12, the turn-off voltage Voff is applied to the unselected drain select line and source select line. In addition, at the time t12, a first under-drive voltage Vun1 may be applied to the selected word line. The first under-drive voltage Vun1 may be used to quickly decrease the voltage of the selected word line from the read pass voltage Vpass. Therefore, the first under-drive voltage Vun1 is determined to be lower than the third read voltage R3 applied thereafter.

At a time t13, the third read voltage R3 is applied to the selected word line. Prior to this, because the first under-drive voltage Vun1 is applied to the selected word line during a period t12 to t13, the voltage of the selected word line may be quickly decreased from the read pass voltage Vpass to the third read voltage R3. During a period t13 to t14, it is determined whether the threshold voltage of the selected memory cells is greater than the third read voltage.

At a time t14, a second under-drive voltage Vun2 is applied to the selected word line. The second under-drive voltage Vun2 may be used to quickly decrease the voltage of the selected word line from the third read voltage R3. Therefore, the second under-drive voltage Vun2 is determined to be lower than the second read voltage R2 applied thereafter.

At a time t15, the second read voltage R2 is applied to the selected word line. Prior to this, because the second under-drive voltage Vun2 is applied to the selected word line during a period t14 to t15, the voltage of the selected word line may be quickly decreased from the third read voltage R3 to the second read voltage R2. During a period t15 to t16, it is determined whether the threshold voltage of the selected memory cells is greater than the second read voltage.

At a time t16, a third under-drive voltage Vun3 is applied to the selected word line. The third under-drive voltage Vun3 may be used to quickly decrease the voltage of the selected word line from the second read voltage R2. Therefore, the third under-drive voltage Vun3 is determined to be lower than the first read voltage R1 applied thereafter.

At a time t17, the first read voltage R1 is applied to the selected word line. Prior to this, because the third under-drive voltage Vun3 is applied to the selected word line during a period t16 to t17, the voltage of the selected word line may be quickly decreased from the second read voltage R2 to the first read voltage R1. During a period t17 to t18, it is determined whether the threshold voltage of the selected memory cells is greater than the first read voltage.

At a time t18, the turn-off voltage Voff may be applied to the selected drain select line DSL and source select line SSL. Meanwhile, at the time t18, the equalizing voltage Veq is applied to the selected word line and the unselected word line. Through this, the equalization operation on the word lines is performed.

At a time t19, the turn-off voltage Voff is applied to the word lines. The read operation may be ended after the time t19.

Referring to FIG. 7, the third read voltage R3 is applied to the selected word line during the period t13 to t14, the second read voltage R2 is applied to the selected word line during the period t15 to t16, and the first read voltage R1 is applied to the selected word line during the period t17 to t18. That is, read voltages are sequentially applied according to the sizes of the read voltages from the highest read voltage R3 to the lowest read voltage R1. In this case, a difference between the read pass voltage Vpass applied to the selected word line during the period t11 to t12 and the third read voltage R3 applied to the selected word line during the period t13 to t14 is relatively small. Therefore, a settling time in which the voltage of the selected word line is decreased from the read pass voltage Vpass to the third read voltage R3 is relatively short. As a result, the read speed for the selected memory cells is improved.

Referring to FIG. 7, the read pass voltage Vpass is applied to the unselected word lines during the period t12 to t13 in which the first under-drive voltage Vun1 is applied to the selected word line. In this case, a voltage drop speed of the selected word line is reduced by a capacitance between the selected word line and adjacent word lines. This causes the read speed of the semiconductor memory device to be reduced.

In accordance with the semiconductor memory device and the method of operating the same according to an embodiment of the present disclosure, while the under-drive voltage is applied to the selected word line, the unselected word lines adjacent to the selected word line are floated. Through this, the voltage drop speed of the selected word line may be improved, and as a result, a read speed of the semiconductor memory device may also be improved.

Figure 8:
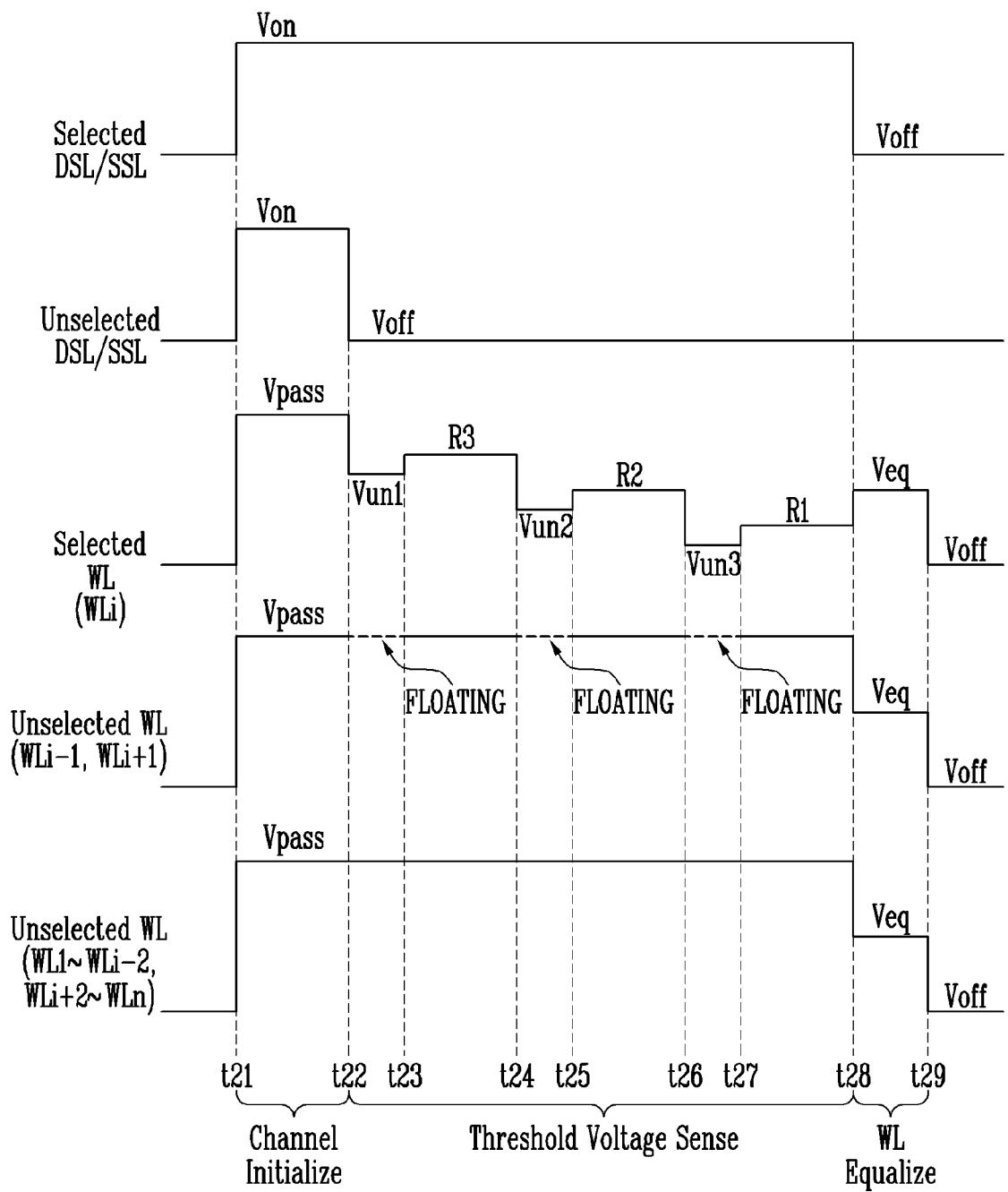
FIG. 8 is a timing diagram illustrating a method of operating a semiconductor memory device according to still another embodiment of the present disclosure.

FIG. 8 is a timing diagram illustrating a method of operating a semiconductor memory device according to another embodiment of the present disclosure. Referring to FIG. 8, the operation method shown in FIG. 8 is performed in a method similar to the operation method shown in FIG. 7 except that the unselected word lines positioned adjacent to the selected word line are floated while the under-drive voltages Vun1, Vun2, and Vun3 are applied to the selected word line. Therefore, an overlapping description is omitted. In FIG. 8, the selected word line is denoted as an i-th word line WLi. The i-th word line WLi is a word line connected to the selected memory cells among the first to n-th word lines WL1 to WLn.

In FIG. 8, the channel initialization step is performed during a period t21 to t22, the threshold voltage sensing step is performed during a period t22 to t28, and the word line equalize step is performed during a period t28 to t29.

At a time t21, the turn-on voltage Von is applied to the selected drain select line and source select line, and the turn-on voltage Von is also applied to the unselected drain select line and source select line. Meanwhile, the read pass voltage Vpass is applied to the selected word line connected to the memory cells to be read, and the read pass voltage is also applied to the unselected word lines.

At a time t22, the turn-off voltage Voff is applied to the unselected drain select line and source select line. In addition, at the time t22, the first under-drive voltage Vun1 may be applied to the selected word line WLi. At the time t22, unselected word lines WLi−1 and WLi+1 positioned adjacent to the selected word line WLi are floated. Meanwhile, at the time t22, the read pass voltage Vpass may be continuously applied to unselected word lines WL1 to WLi−2 and WLi+2 to WLn that are not adjacent to the selected word line WLi. During a period t22 to t23, because the unselected word lines WLi−1 and WLi+1 positioned adjacent to the selected word line WLi are floated, the voltage of the selected word line WLi may be more quickly decreased.

At a time t23, the third read voltage R3 is applied to the selected word line WLi, and the read pass voltage Vpass is applied to the unselected word lines WLi−1 and WLi+1 positioned adjacent to the selected word line. During a period t23 to t24, it is determined whether the threshold voltage of the selected memory cells is greater than the third read voltage.

In such a method, during a period t24 to t25, the unselected word lines WLi−1 and WLi+1 positioned adjacent to the selected word line WLi may be floated. Through this, the voltage of the selected word line WLi may be quickly decreased from the third read voltage R3 to the second read voltage R2. In addition, during a period t26 to t27, the unselected word lines WLi−1 and WLi+1 positioned adjacent to the selected word line WLi may be floated. Through this, the voltage of the selected word line WLi may be quickly decreased from the second read voltage R2 to the first read voltage R1.

As shown in FIG. 8, in accordance with the semiconductor memory device and the method of operating the same according to an embodiment of the present disclosure, during the period t22 to t23, t24 to t25, and t26 to t27 in which the under-drive voltages Vun1, Vun2, and Vun3 are applied to the selected word line WLi, the unselected word lines WLi−1 and WLi+1 adjacent to the selected word line are floated. Through this, the voltage drop speed of the selected word line may be improved, and as a result, the read speed of the semiconductor memory device may also be improved.

Meanwhile, FIG. 8 shows an embodiment in which only the unselected word lines WLi−1 and WLi+1 positioned immediately adjacent to the selected word line WLi are floated, but the present disclosure is not limited thereto. According to an embodiment, p word lines WLi−1 to WLi−p successively disposed from the selected word line WLi to a direction of the source select line SSL and q word lines WLi+1 to WLi+q successively disposed from the selected word line WLi in a direction of the drain select line DSL may be floated. Here, p and q may be integers greater than 1.

Referring to FIG. 8, the period t22 to t23 in which the unselected word lines WLi−1 and WLi+1 positioned adjacent to the selected word line maintain a floating state and the period t22 to t23 in which the under-drive voltage is applied to the selected word line WLi are shown to be the same. However, this is an example, and the present disclosure is not limited thereto.

In an embodiment, the period in which the adjacent unselected word lines WLi−1 and WLi+1 maintain the floating state may be longer than the period in which the under-drive voltage is applied to the selected word line WLi. In an embodiment, the period in which the under-drive voltage is applied to the selected word line WLi may be included in the period in which the adjacent unselected word lines WLi−1 and WLi+1 maintain the floating state.

In another embodiment, the period in which the adjacent unselected word lines WLi−1 and WLi+1 maintain the floating state may be shorter than the period in which the under-drive voltage is applied to the selected word line WLi. In an embodiment, the period in which the adjacent unselected word lines WLi−1 and WLi+1 maintain the floating state may be included in the period in which the under-drive voltage is applied to the selected word line WLi.

In still another embodiment, the period in which the adjacent unselected word lines WLi−1 and WLi+1 maintain the floating state may overlap the period in which the under-drive voltage is applied to the selected word line WLi by at least a partial period. In this case, the under-drive voltage may be applied to the selected word line WLi after the adjacent unselected word lines WLi−1 and WLi+1 are floated, or the adjacent unselected word lines WLi−1 and WLi+1 may be floated after the under-drive voltage is applied to the selected word line WLi.

Figure 9:
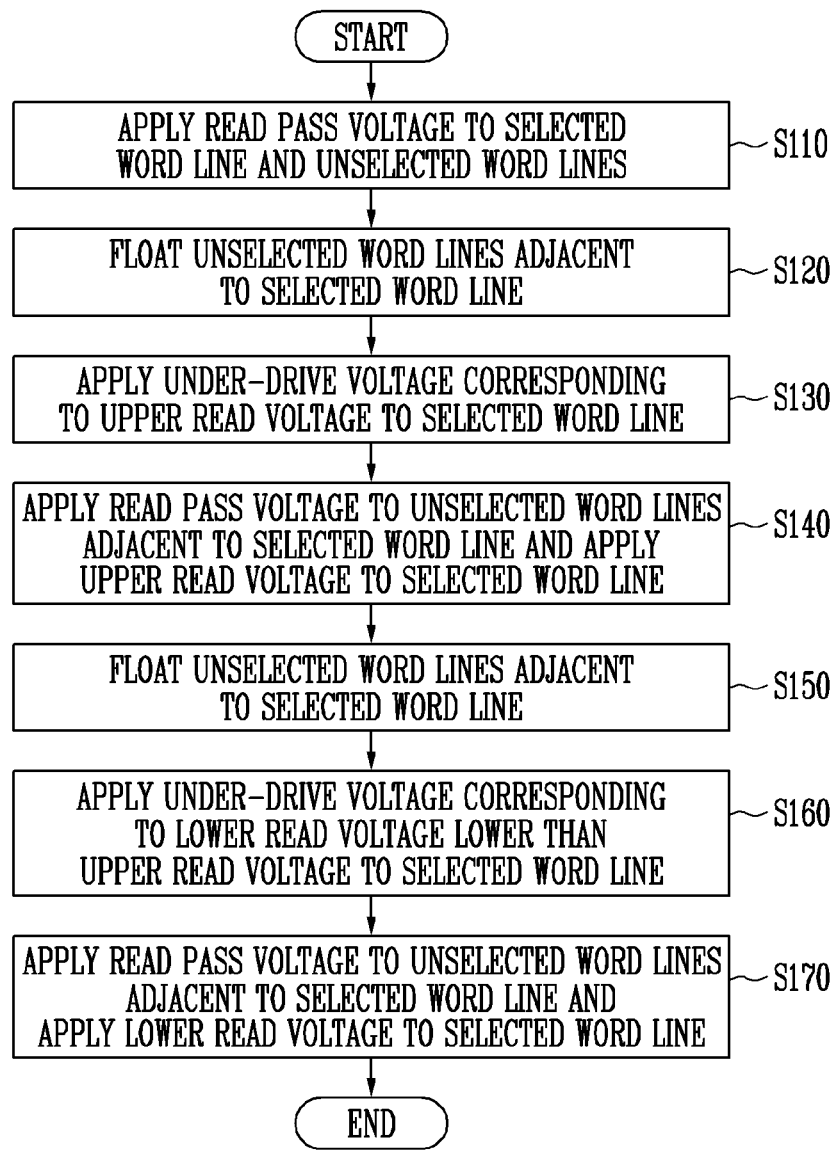
FIG. 9 is a flowchart illustrating a method of operating a semiconductor memory device according to still another embodiment of the present disclosure.

FIG. 9 is a flowchart illustrating a method of operating a semiconductor memory device according to still another embodiment of the present disclosure. Hereinafter, the present disclosure is described with reference to FIGS. 8 and 9 together.

Referring to FIG. 9, the method of operating the semiconductor memory device according to still another embodiment of the present disclosure includes applying the read pass voltage to the selected word line and the unselected word lines (S110), floating the unselected word lines adjacent to the selected word line (S120), applying an under-drive voltage corresponding to an upper read voltage to the selected word line (S130), applying the read pass voltage to the unselected word lines adjacent to the selected word line and applying an upper read voltage to the selected word line (S140), floating the unselected word lines adjacent to the selected word line (S150), applying an under-drive voltage corresponding to a lower read voltage lower than the upper read voltage to the selected word line (S160), and applying the lower read voltage to the selected word line (S170).

In step S110, the read pass voltage Vpass may be applied to the selected word line WLi and the unselected word lines WL1 to WLi−1 and WLi+1 to WLn for channel initialization. That is, step S110 may correspond to an operation during the period t21 to t22 of FIG. 8.

Thereafter, in step S120, the unselected word lines WLi−1 and WLi+1 adjacent to the selected word line WLi are floated. In addition, in step S130, the under-drive voltage corresponding to the upper read voltage is applied to the selected word line.

The upper read voltage may mean a read voltage relatively higher than the lower read voltage. In FIG. 8, the present disclosure is described based on the first to third read voltages R1 to R3 used for the read operation of the MLC, but the present disclosure is not limited thereto. That is, according to the present disclosure, the read pass voltage may be applied to the selected word line to perform a channel initialization operation, an upper read voltage that is relatively high may be applied to the selected word line, and then a lower read voltage that is relatively low may be applied to the selected word line.

Referring to an example of FIG. 8, in an embodiment, the upper read voltage may be the third read voltage R3. In this case, the under-drive voltage corresponding to the upper read voltage may be the first under-drive voltage Vun1. In addition, the lower read voltage may be the second read voltage R2 or the first read voltage R1. When the lower read voltage is the second read voltage R2, the under-drive voltage corresponding to the lower read voltage may be the second under-drive voltage Vun2. Meanwhile, when the lower read voltage is the first read voltage R1, the under-drive voltage corresponding to the lower read voltage may be the third under-drive voltage Vun3.

In another embodiment, the upper read voltage may be the second read voltage R2. In this case, the under-drive voltage corresponding to the upper read voltage may be the second under-drive voltage Vun2. In addition, the lower read voltage may be the first read voltage R1, and the under-drive voltage corresponding to the lower read voltage may be the third under-drive voltage Vun3.

Hereinafter, the present disclosure is described using a case in which the upper read voltage is the third read voltage R3 and the lower read voltage is the second read voltage R2 as an example. In step S130, the first under-drive voltage Vun1 corresponding to the upper read voltage, that is, the third read voltage R3 is applied to the selected word line WLi. That is, steps S120 and S130 may be performed during the period t22 to t23. In FIG. 9, step S130 is performed after step S120 is performed, but the present disclosure is not limited thereto. That is, after step S130 is performed, step S120 may be performed, or steps S120 and S130 may be performed simultaneously.

Thereafter, in step S140, the read pass voltage Vpass is applied to the unselected word lines WLi−1 and WLi+1 adjacent to the selected word line WLi, and the upper read voltage, that is, the third read voltage R3, is applied to the selected word line WLi. Step S140 corresponds to an operation performed during the period t23 to t24 of FIG. 8.

Thereafter, in step S150, the unselected word lines WLi−1 and WLi+1 adjacent to the selected word line WLi are floated. In addition, in step S160, the second under-drive voltage Vun2 corresponding to the lower read voltage, that is, the second read voltage R2, is applied to the selected word line. That is, steps S150 and S160 may be performed during the period t24 to t25.

Thereafter, in step S170, the read pass voltage Vpass is applied to the unselected word lines WLi−1 and WLi+1 adjacent to the selected word line WLi, and the lower read voltage, that is, the second read voltage R2, is applied to the selected word line WLi. Step S170 corresponds to an operation performed during the period t25 to t26 of FIG. 8.

Figure 10:
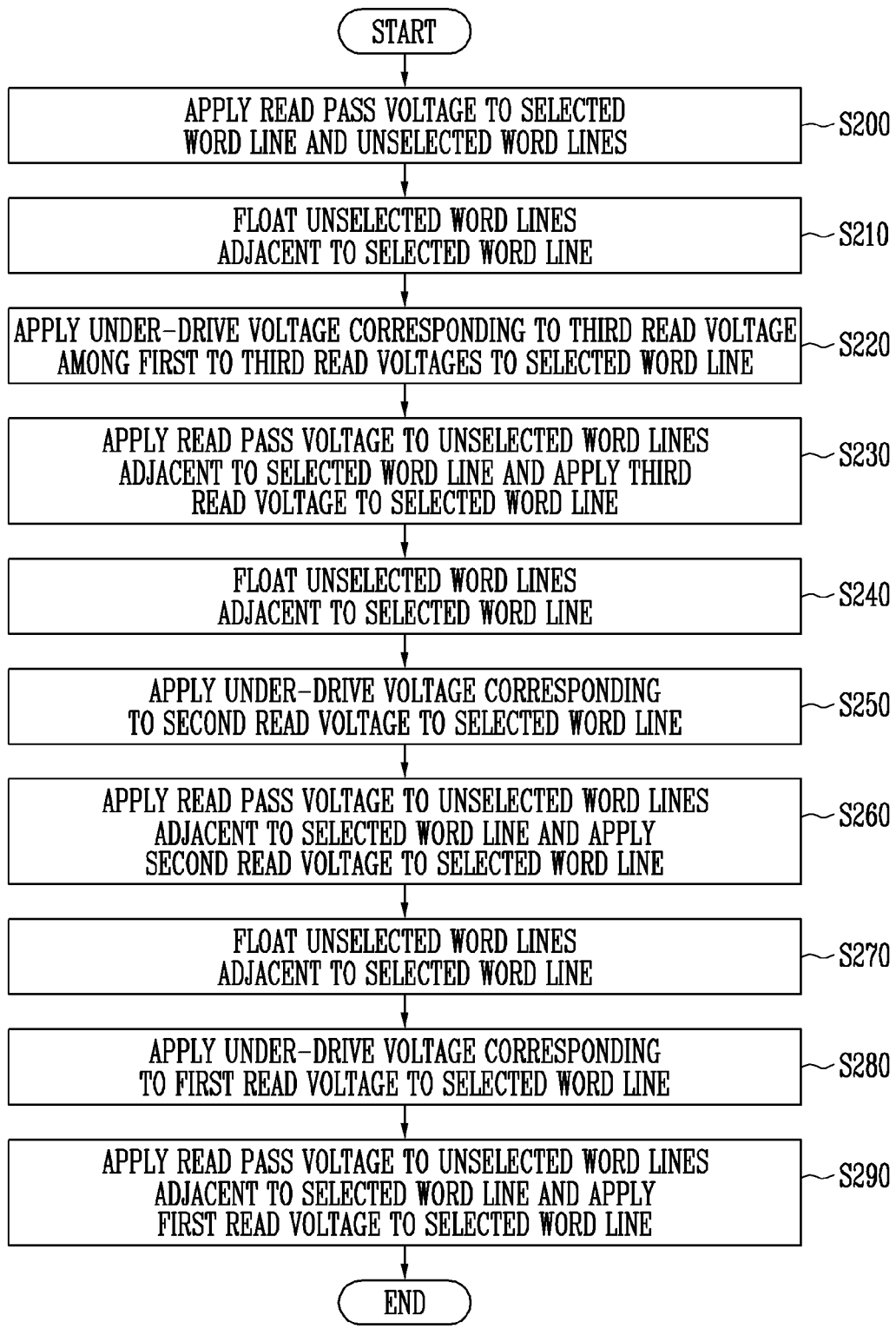
FIG. 10 is a flowchart illustrating a method of operating a semiconductor memory device according to still another embodiment of the present disclosure.

FIG. 10 is a flowchart illustrating a method of operating a semiconductor memory device according to still another embodiment of the present disclosure. FIG. 10 is a flowchart illustrating a method of operating a semiconductor memory device according to still another embodiment of the present disclosure in an aspect different from that of FIG. 9.

Referring to FIG. 10, the method of operating the semiconductor memory device according to still another embodiment of the present disclosure includes applying the read pass voltage to the selected word line and the unselected word lines (S200), floating the unselected word lines adjacent to the selected word line (S210), applying the under-drive voltage corresponding to the third read voltage among the first to third read voltages to the selected word line (S220), applying the read pass voltage to the unselected word lines adjacent to the selected word line and applying the third read voltage to the selected word line (S230), floating the unselected word lines adjacent to the selected word line (S240), applying the under-drive voltage corresponding to the second read voltage to the selected word line (S250), applying the read pass voltage to the unselected word lines adjacent to the selected word line and applying the second read voltage to the selected word line (S260), floating the unselected word lines adjacent to the selected word line (S270), applying the under-drive voltage corresponding to the first read voltage to the selected word line (S280), and applying the read pass voltage to the unselected word lines adjacent to the selected word line and applying the first read voltage to the selected word lines (S290).

In step S200, the read pass voltage Vpass may be applied to the selected word line WLi and the unselected word lines WL1 to WLi−1 and WLi+1 to WLn for channel initialization. That is, step S200 may correspond to the operation during the period t21 to t23 of FIG. 8.

Thereafter, in step S210, the unselected word lines WLi−1 and WLi+1 adjacent to the selected word line WLi are floated. In addition, in step S220, the first under-drive voltage Vun1 corresponding to the third read voltage R3 is applied to the selected word line WLi. That is, steps S210 and S220 may be performed during the period t22 to t23. In FIG. 10, step S220 is performed after step S210 is performed, but the present disclosure is not limited thereto. That is, step S210 may be performed after step S220 is performed, or steps S210 and S220 may be performed simultaneously.

Thereafter, in step S230, the read pass voltage Vpass is applied to the unselected word lines WLi−1 and WLi+1 adjacent to the selected word line WLi, and the third read voltage R3 is applied. Step S230 corresponds to the operation performed during the period t23 to t24 of FIG. 8.

Thereafter, in step S240, the unselected word lines WLi−1 and WLi+1 adjacent to the selected word line WLi are floated. In addition, in step S250, the second under-drive voltage Vun2 corresponding to the second read voltage R2 is applied to the selected word line. That is, steps S240 and S250 may be performed during the period t24 to t25.

Thereafter, in step S260, the read pass voltage Vpass is applied to the unselected word lines WLi−1 and WLi+1 adjacent to the selected word line WLi, and the second read voltage R2 is applied to the selected word line WLi. Step S260 corresponds to the operation performed during the period t25 to t26 of FIG. 8.

Thereafter, in step S270, the unselected word lines WLi−1 and WLi+1 adjacent to the selected word line WLi are floated. In addition, in step S280, the third under-drive voltage Vun3 corresponding to the first read voltage R1 is applied to the selected word line. That is, steps S270 and S280 may be performed during the period t26 to t27.

Thereafter, in step S290, the read pass voltage Vpass is applied to the unselected word lines WLi−1 and WLi+1 adjacent to the selected word line WLi, and the first read voltage R1 is applied to the selected word line WLi. Step S290 corresponds to the operation performed during the period t27 to t28 of FIG. 8.

According to the embodiment of the present disclosure described with reference to FIGS. 8 to 10, the unselected word lines WLi−1 and WLi+1 adjacent to the selected word line are floated during the periods t22 to t23, t24 to t25, and t26 to t27 in which the under-drive voltages Vun1, Vun2, and Vun3 are applied to the selected word line WLi. Through this, the voltage drop speed of the selected word line may be improved, and as a result, the read speed of the semiconductor memory device may also be improved.

However, as the unselected word lines WLi−1 and WLi+1 adjacent to the selected word line are floated and the under-drive voltages Vun1, Vun2, and Vun3 are applied to the selected word line WLi, a voltage of the unselected word lines WLi−1 and WLi+1 adjacent to the selected word line becomes lower than the read pass voltage Vpass during the period t22 to t23, t24 to t25, and t26 to t27. This may affect a cell current when the threshold voltage of the memory cells is sensed during subsequent periods t23 to t24, t25 to t26, and t27 to t28, and becomes a factor of lowering read accuracy.

According to still another embodiment of the present disclosure, a read pass voltage higher than a read pass voltage applied to other unselected word lines is applied to the unselected word lines WLi−1 and WLi+1 adjacent to the selected word line. Accordingly, even though the unselected word lines WLi−1 and WLi+1 adjacent to the selected word line are floated and the voltage of the unselected word lines WLi−1 and WLi+1 adjacent to the selected word line are lowered while the under-drive voltages Vun1, Vun2, and Vun3 are applied to the selected word line WLi, an effect on the cell current when the threshold voltage of the memory cells is sensed may be reduced or minimized. As a result, the read accuracy may be improved. Hereinafter, the present disclosure is described with reference to FIGS. 11 and 12.

Figure 11:
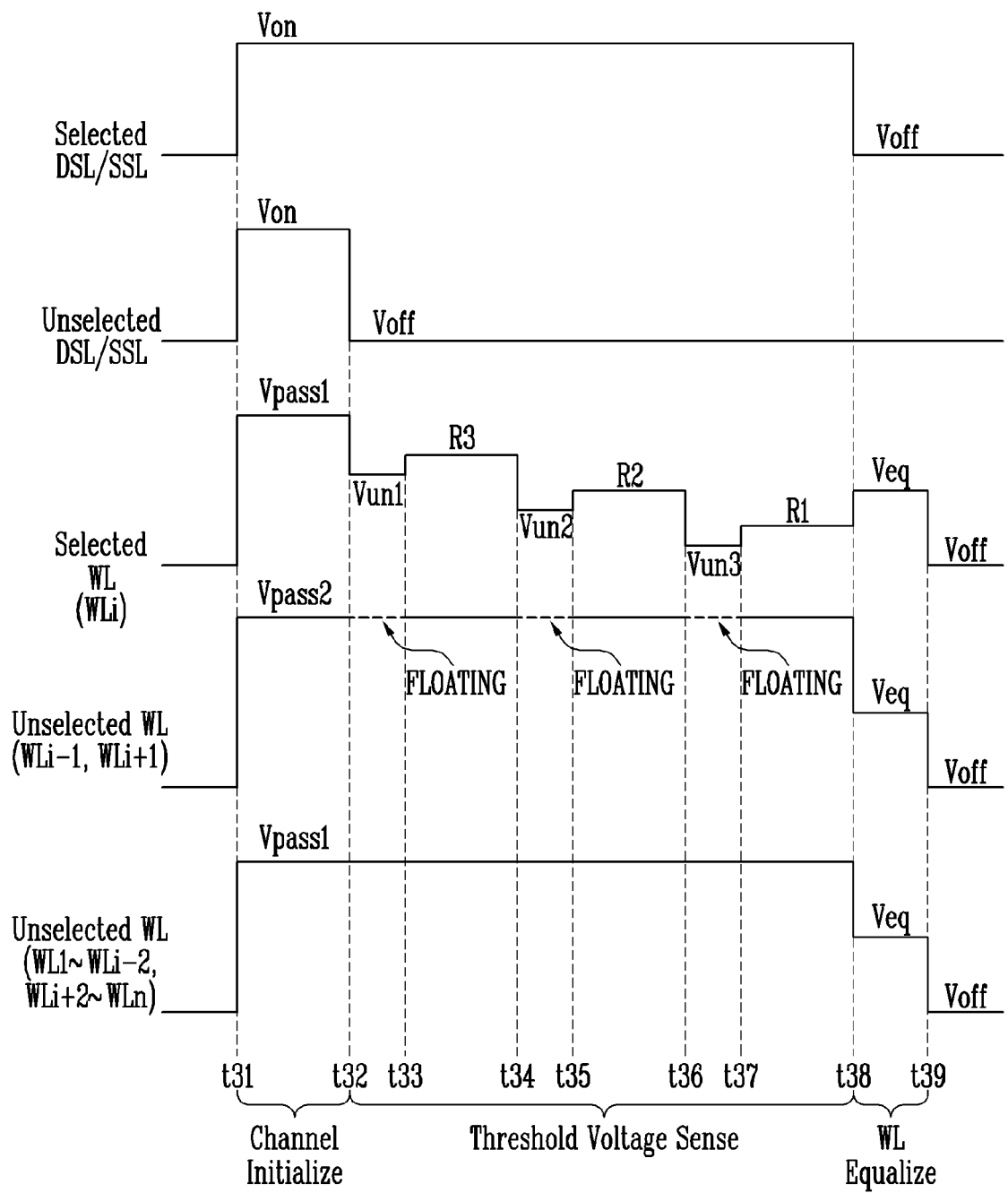
FIG. 11 is a timing diagram illustrating a method of operating a semiconductor memory device according to still another embodiment of the present disclosure.

FIG. 11 is a timing diagram illustrating a method of operating a semiconductor memory device according to still another embodiment of the present disclosure. Referring to FIG. 11, the operation method shown in FIG. 11 is performed in a method similar to the operation method shown in FIG. 8 except that a first read pass voltage Vpass1 is applied to the unselected word lines WL1 to WLi−2 and WLi+2 to WLn that are not adjacent to the selected word line WLi and a second read pass voltage Vpass2 is applied to the unselected word lines WLi−1 and WLi+1 adjacent to the selected word line WLi. Therefore, an overlapping description is omitted.

At a time t31, the first read pass voltage Vpass1 is applied to the unselected word lines WL1 to WLi−2 and WLi+2 to WLn that are not adjacent to the selected word line WLi and the second read pass voltage Vpass2 is applied to the unselected word lines WLi−1 and WLi+1 adjacent to the selected word line WLi. The first read pass voltage Vpass1 may be substantially the same as the read pass voltage Vpass shown in FIG. 5. The second read pass voltage Vpass2 may be higher than the first read pass voltage Vpass1. Thereafter, during a period t32 to t33, when the unselected word lines WLi−1 and WLi+1 adjacent to the selected word line WLi are floated and the first under-drive voltage Vun1 is applied to the selected word line WLi, the voltage of the unselected word lines WLi−1 and WLi+1 adjacent to the selected word line WLi may be somewhat decreased from the second read pass voltage Vpass2. However, because the second read pass voltage Vpass2 is higher than the first read pass voltage Vpass1, even though the voltage of the unselected word lines WLi−1 and WLi+1 adjacent to the selected word line WLi is somewhat decreased, the effect on the cell current when the threshold voltage of the memory cells is sensed may be reduced or minimized. As a result, the read accuracy may be improved.

Subsequently, the second read pass voltage Vpass2 may be applied to the unselected word lines WLi−1 and WLi+1 adjacent to the selected word line WLi also in periods t33 to t34, t35 to t36, and t37 to t38.

Figure 12:
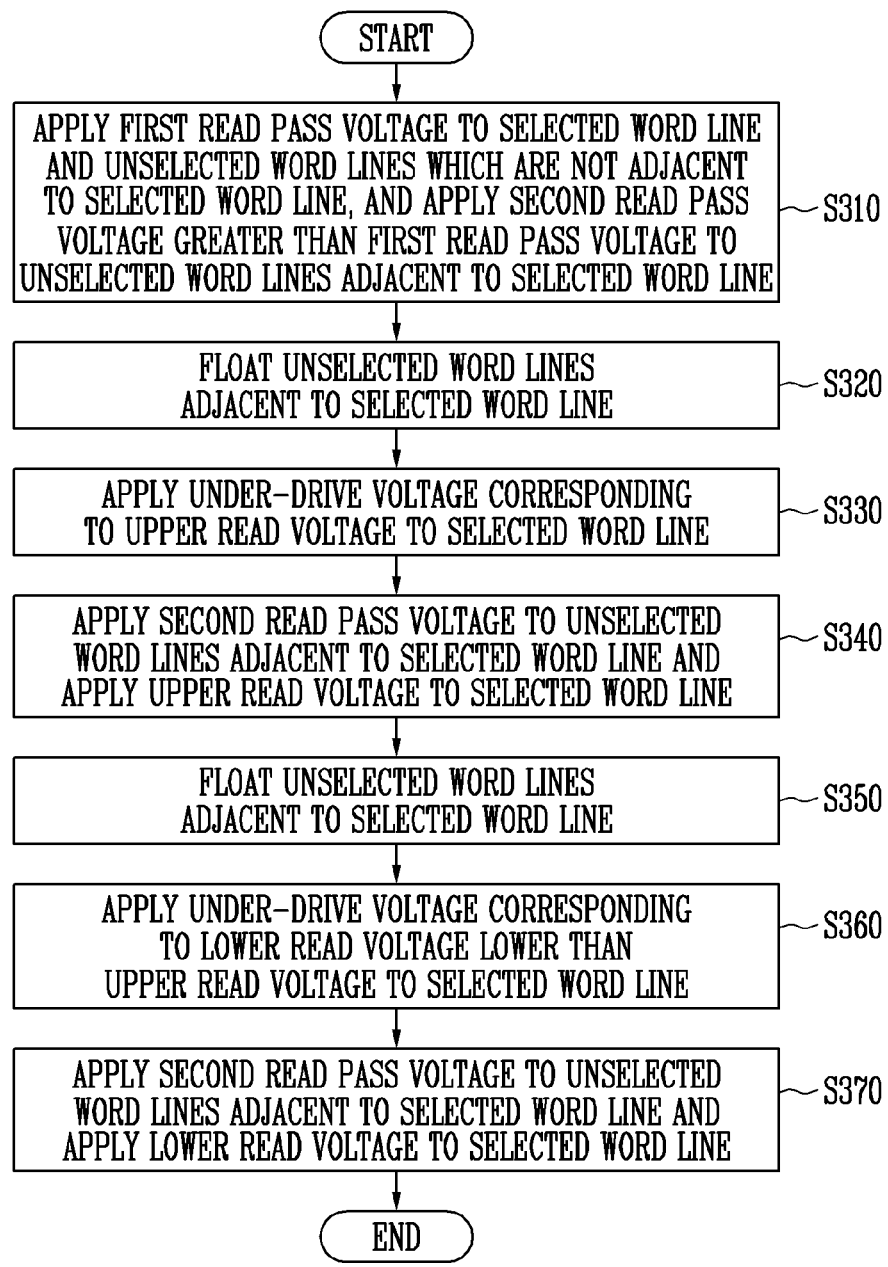
FIG. 12 is a flowchart illustrating a method of operating a semiconductor memory device according to still another embodiment of the present disclosure.

FIG. 12 is a flowchart illustrating a method of operating a semiconductor memory device according to still another embodiment of the present disclosure.

Referring to FIG. 12, the method of operating the semiconductor memory device according to still another embodiment of the present disclosure includes applying the first read pass voltage to the selected word line and the unselected word lines which are not adjacent to the selected word line and applying the second read pass voltage greater than the first read pass voltage to the unselected word lines adjacent to the selected word line (S310), floating the unselected word lines adjacent to the selected word line (S320), applying the under-drive voltage corresponding to the upper read voltage to the selected word line (S330), applying the second read pass voltage to the unselected word lines adjacent to the selected word line and applying the upper read voltage to the selected word line (S340), floating the unselected word lines adjacent to the selected word line (S350), applying the under-drive voltage corresponding to the lower read voltage lower than the upper read voltage to the selected word line (S360), and applying the second read pass voltage to the unselected word lines adjacent to the selected word line and applying the lower read voltage to the selected word line (S370). The method of operating the semiconductor memory device shown in FIG. 12 is similar to the method shown in FIG. 9 except that the first read pass voltage is applied to the unselected word lines that are not adjacent to the selected word line and the second read pass voltage greater than the first read pass voltage is applied to the unselected word lines adjacent to the selected word line. Therefore, an overlapping description is omitted.

In step S310, the first read pass voltage Vpass1 may be applied to the selected word line WLi for channel initialization, and the first read pass voltage Vpass1 may be applied to the unselected word lines WL1 to WLi−2 and WLi+2 to WLn that are not adjacent to the selected word line WLi. In addition, in step S310, the second read pass voltage Vpass1 may be applied to the unselected word lines WLi−1 and WLi+1 adjacent to the selected word line WLi. That is, step S310 may correspond to an operation during the period t31 to t32 of FIG. 11.

Thereafter, in step S320, the unselected word lines WLi−1 and WLi+1 adjacent to the selected word line WLi are floated. In addition, in step S330, the under-drive voltage corresponding to the upper read voltage is applied to the selected word line. As described with reference to FIG. 9, the present disclosure is described using the case in which the upper read voltage is the third read voltage R3 and the lower read voltage is the second read voltage R2 as an example. In step S330, the first under-drive voltage Vun1 corresponding to the upper read voltage, that id, the third read voltage R3 is applied to the selected word line WLi. That is, steps S320 and S330 may be performed during the period t32 to t33.

Thereafter, in step S340, the second read pass voltage Vpass2 is applied to the unselected word lines WLi−1 and WLi+1 adjacent to the selected word line WLi, and the upper read voltage, that is, the third read voltage R3 is applied to the selected word line WLi. Step S340 corresponds to an operation performed during the period t33 to t34 of FIG. 11.

Thereafter, in step S350, the unselected word lines WLi−1 and WLi+1 adjacent to the selected word line WLi are floated. In addition, in step S360, the second under-drive voltage Vun2 corresponding to the lower read voltage, that is, the second read voltage R2 is applied to the selected word line. That is, steps S350 and S360 may be performed during the period t34 to t35.

Thereafter, in step S370, the second read pass voltage Vpass2 is applied to the unselected word lines WLi−1 and WLi+1 adjacent to the selected word line WLi, and the lower read voltage, that is, the second read voltage R2, is applied to the selected word line WLi. Step S370 corresponds to an operation performed during the period t35 to t36 of FIG. 11.

According to the embodiment described with reference to FIGS. 11 and 12, the first read pass voltage Vpass1 is applied to the unselected word lines WL1 to WLi−2 and WLi+2 to WLn that are not adjacent to the selected word line WLi and the second read pass voltage Vpass2 higher than the first read pass voltage is applied to the unselected word lines WLi−1 and WLi+1 adjacent to the selected word line WLi. Therefore, even though the voltage of the unselected word lines WLi−1 WLi=1 adjacent to the word line WLi is somewhat decreased because the unselected word lines WLi−1 and WLi+1 adjacent to the selected word line WLi are floated and the under-drive voltages Vun1, Vun2, and Vun3 are applied to the selected word line WLi, the effect on the cell current when the threshold voltage of the memory cells is sensed may be reduced or minimized. As a result, the read accuracy may be improved.

According to the embodiment described with reference to FIGS. 11 and 12, the second read pass voltage Vpass2, which is fixed, is applied to the adjacent unselected word lines WLi−1 and WLi+1 regardless of a voltage drop width of the selected word line WLi. In this case, it is not easy to control the voltage of the adjacent unselected word lines WLi−1 and WLi+1 when the threshold voltage of the selected memory cells is sensed.

According to still another embodiment of the present disclosure, the read pass voltage applied to the adjacent unselected word lines WLi−1 and WLi+1 is determined based on the voltage drop width of the selected word line WLi. Therefore, stability of the read operation is improved. Hereinafter, the present disclosure is described with reference to FIGS. 13 and 14.

Figure 13:
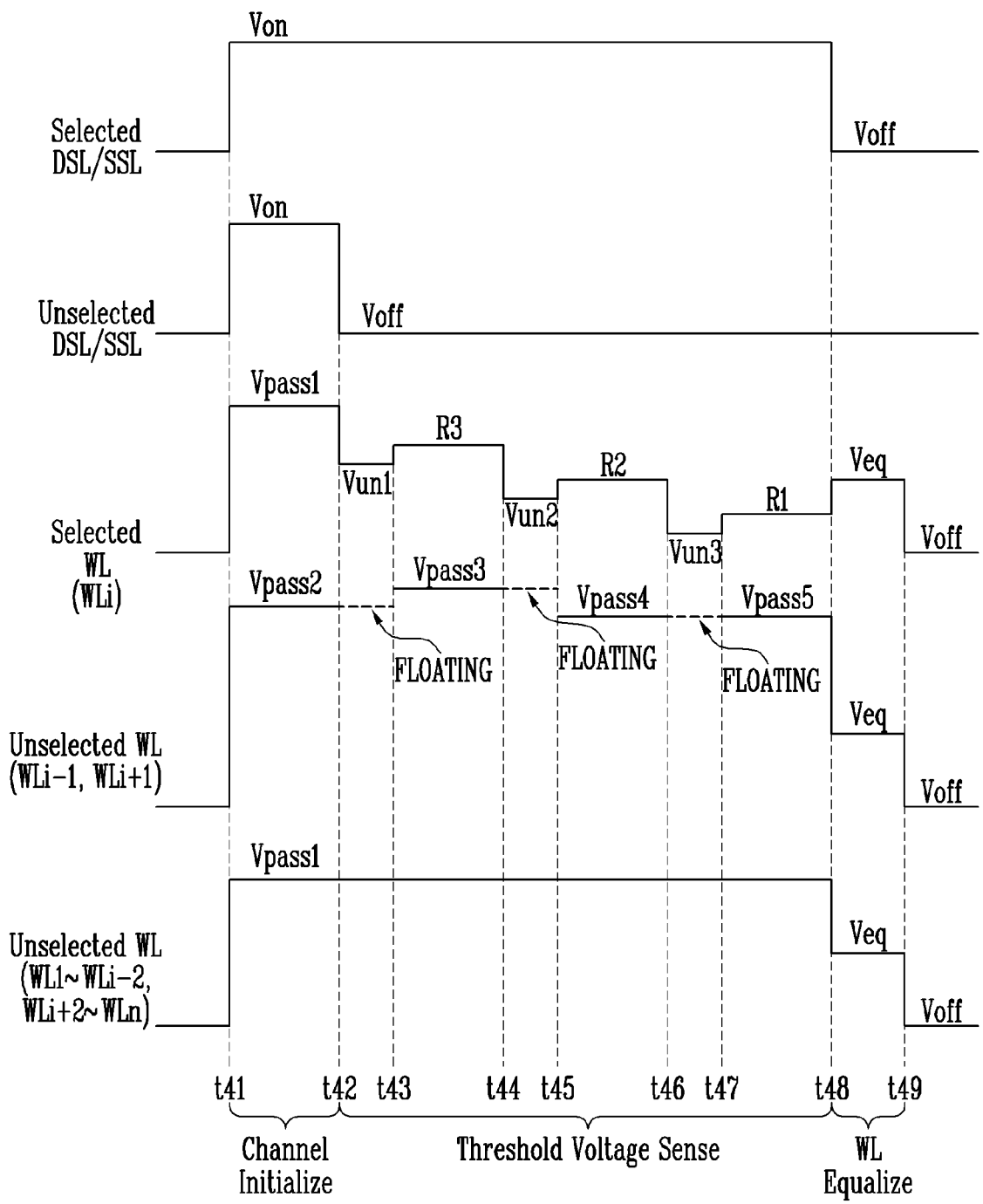
FIG. 13 is a timing diagram illustrating a method of operating a semiconductor memory device according to still another embodiment of the present disclosure.

FIG. 13 is a timing diagram illustrating a method of operating a semiconductor memory device according to still another embodiment of the present disclosure.

Referring to FIG. 13, the operation method shown in FIG. 13 is performed in the operation method shown in FIG. 11 except that a second read pass voltage Vpass2, a third read pass voltage Vpass3, a fourth read pass voltage Vpass4, and a fifth read pass voltage Vpass5 are applied to the unselected word lines WLi−1 and WLi+1 adjacent to the selected word line WLi. Therefore, an overlapping description is omitted.

At a time t41, the first read pass voltage Vpass1 is applied to the unselected word lines WL1 to WLi−2 and WLi+2 to WLn that are not adjacent to the selected word line WLi, and the second read pass voltage Vpass2 is applied to the unselected word lines WLi−1 and WLi+1 adjacent to the selected word line WLi. The first read pass voltage Vpass1 may be substantially the same as the read pass voltage Vpass shown in FIG. 5. The second read pass voltage Vpass2 may be higher than the first read pass voltage Vpass1. In addition, the second read pass voltage may be determined according to the voltage drop width of the selected word line WLi during a period t42 to t43.

Specifically, when the voltage drop width of the selected word line WLi is large during the period t42 to t43, a voltage drop width of the floated unselected word lines WLi−1 and WLi+1 may also be large. Therefore, in this case, a relatively high voltage may be determined as the second read pass voltage Vpass2. Conversely, when the voltage drop width of the selected word line WLi is small during the period t42 to t43, the voltage drop width of the floated unselected word lines WLi−1 and WLi+1 may also be small. Therefore, in this case, a relatively low voltage may be determined as the second read pass voltage Vpass2.

For example, the second read pass voltage may be determined based on Equation 1 below.

$$Vpass2 = Vpass1 + k1(Vpass1 - Vun1) \quad \text{[Equation 1]}$$

In Equation 1 above, k1 is a positive number. Therefore, the second read pass voltage Vpass2 may be a voltage greater than the first read pass voltage Vpass1, and may be a voltage determined according to a difference between the first read pass voltage Vpass1 and the first under-drive voltage Vun1.

Meanwhile, at a time t43, the third read pass voltage Vpass3 is applied to the unselected word lines WLi−1 and WLi+1 adjacent to the selected word line WLi. The third read pass voltage Vpass3 may be higher than the first read pass voltage Vpass1. In addition, the third read pass voltage may be determined according to the voltage drop width of the selected word line WLi during a period t44 to t45. For example, the third read pass voltage may be determined based on Equation 2 below.

$$Vpass3=Vpass1+k2(R3-Vun2) \quad \text{[Equation 2]}$$

In Equation 2 above, k2 is a positive number. Therefore, the third read pass voltage Vpass3 may be a voltage greater than the first read pass voltage Vpass1 and may be a voltage determined according to a difference between the third read voltage R3 and the second under-drive voltage Vun2.

In addition, at a time t45, the fourth read pass voltage Vpass4 is applied to the unselected word lines WLi−1 and WLi+1 adjacent to the selected word line WLi. The fourth read pass voltage Vpass4 may be higher than the first read pass voltage Vpass1. In addition, the fourth read pass voltage may be determined according to the voltage drop width of the selected word line WLi during a period t46 to t47. For example, the fourth read pass voltage may be determined based on Equation 3 below.

$$Vpass4=Vpass1+k3(R2-Vun3) \quad \text{[Equation 3]}$$

In Equation 3 above, k3 is a positive number. Therefore, the fourth read pass voltage Vpass4 may be a voltage greater than the first read pass voltage Vpass1 and may be a voltage determined according to a difference between the second read voltage R2 and the third under-drive voltage Vun3.

Figure 14:
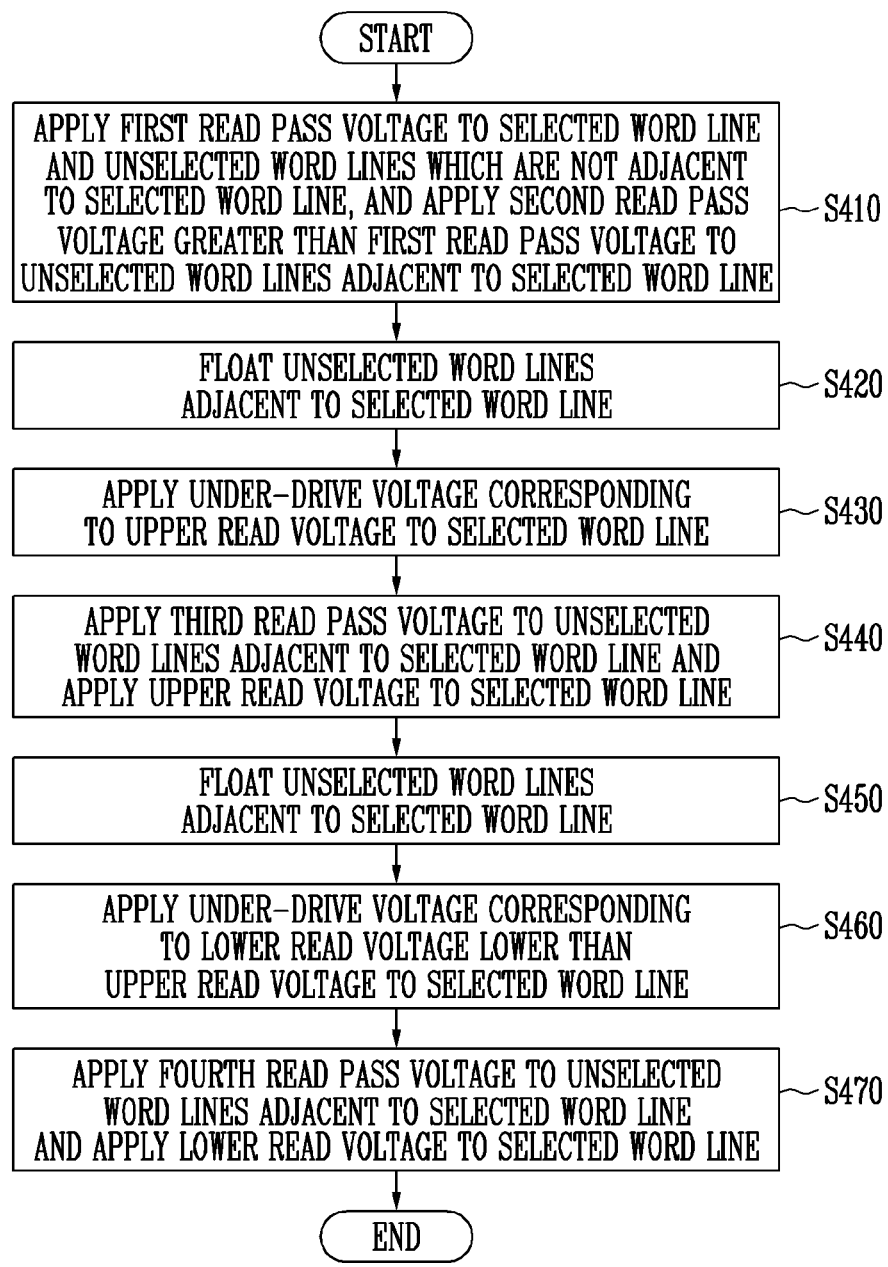
FIG. 14 is a flowchart illustrating a method of operating a semiconductor memory device according to still another embodiment of the present disclosure.

FIG. 14 is a flowchart illustrating a method of operating a semiconductor memory device according to still another embodiment of the present disclosure.

Referring to FIG. 14, the method of operating the semiconductor memory device according to still another embodiment of the present disclosure includes applying the first read pass voltage to the selected word line and the unselected word lines that are not adjacent to the selected word line and applying the second read pass voltage greater than the first read pass voltage to the unselected word lines adjacent to the selected word line (S410), floating the unselected word lines adjacent to the selected word line (S420), applying the under-drive voltage corresponding to the upper read voltage to the selected word line (S430), applying the third read pass voltage to the unselected word lines adjacent to the selected word line and applying the upper read voltage to the selected word line (S440), floating the unselected word lines adjacent to the selected word line (S450), applying the under-drive voltage corresponding to the lower read voltage lower than the upper read voltage to the selected word line (S460), and applying the fourth read pass voltage to the unselected word lines adjacent to the selected word line and applying the lower read voltage to the selected word line (S470). The method of operating the semiconductor memory device shown in FIG. 14 is similar to the method shown in FIG. 12 except that the second read pass voltage, the third read pass voltage, or the fourth read pass voltage is applied to the unselected word lines adjacent to the selected word line. Therefore, an overlapping description is omitted. As described with reference to FIGS. 9 and 12, the present disclosure is described using the case in which the upper read voltage is the third read voltage R3 and the lower read voltage is the second read voltage R2 as an example.

In step S410, the first read pass voltage Vpass1 may be applied to the selected word line WLi for channel initialization, and the first read pass voltage Vpass1 may be applied to the unselected word lines WL1 to WLi−2 and WLi+2 to WLn that are not adjacent to the selected word line WLi. In addition, in step S410, the second read pass voltage Vpass1 may be applied to the unselected word lines WLi−1 and WLi+1 adjacent to the word line WLi selected.

As described above, the second read pass voltage may be determined based on a difference between the first read pass voltage and the under-drive voltage corresponding to the upper read voltage. Specifically, the second read pass voltage may be determined based on a difference between the first read pass voltage and the first under-drive voltage. That is, the second read pass voltage may be determined based on Equation 1 described above.

Thereafter, in step S420, the unselected word lines WLi−1 and WLi+1 adjacent to the selected word line WLi are floated. In addition, in step S430, the under-drive voltage corresponding to the upper read voltage is applied to the selected word line. In step S430, the first under-drive voltage Vun1 corresponding to the upper read voltage, that is, the third read voltage R3 is applied to the selected word line WLi.

Thereafter, in step S440, the third read pass voltage Vpass3 is applied to the unselected word lines WLi−1 and WLi+1 adjacent to the selected word line WLi, and the upper read voltage, that is, the third read voltage R3 is applied to the selected word line WLi. The third read pass voltage may be determined based on a difference between the upper read voltage and the under-drive voltage corresponding to the lower read voltage. More specifically, the third read pass voltage Vpass3 may be determined based on a difference between the third read voltage R3 and the second under-drive voltage Vun2. That is, the third read pass voltage may be determined based on Equation 2 described above.

Thereafter, in step S450, the unselected word lines WLi−1 and WLi+1 adjacent to the selected word line WLi are floated. In addition, in step S460, the second under-drive voltage Vun2 corresponding to the lower read voltage, that is, the second read voltage R2 is applied to the selected word line.

Thereafter, in step S470, the fourth read pass voltage Vpass2 is applied to the unselected word lines WLi−1 and WLi+1 adjacent to the selected word line WLi, and the lower read voltage, that is, the second read voltage R2 is applied to the selected word line WLi.

According to the embodiment described with reference to FIGS. 13 and 14, the read pass voltage applied to the adjacent unselected word lines WLi−1 and WLi+1 is determined based on the voltage drop width of the selected word line WLi. Therefore, the stability of the read operation is improved.

The embodiments of the present disclosure applied to the read operation of the selected memory cells are described with reference to FIGS. 6 to 14. However, the present disclosure is not limited thereto, and may also be applied to the verify operation of the selected memory cells.

Figure 15:
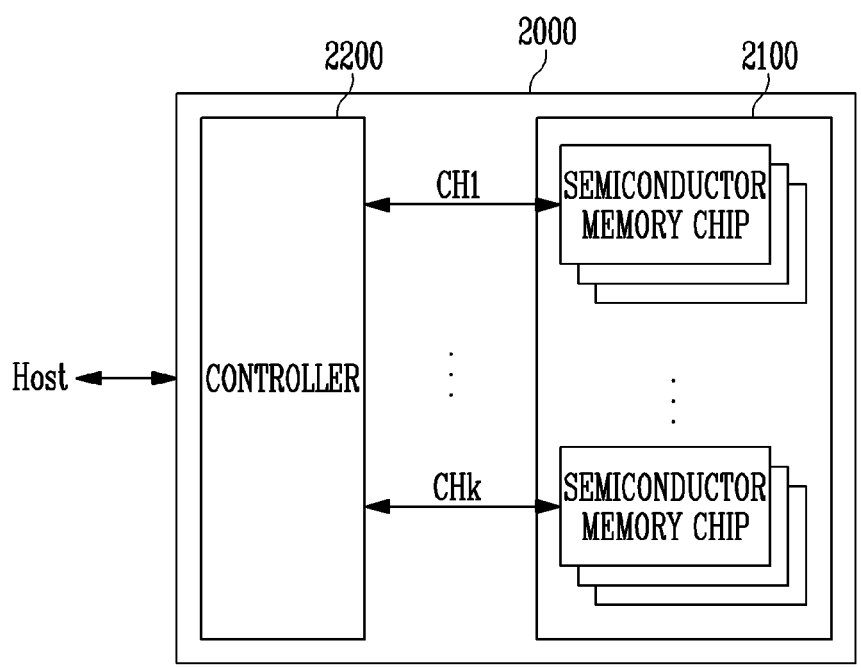
FIG. 15 is a block diagram illustrating an application example 2000 of a storage device including a semiconductor memory device according to an embodiment of the present disclosure.

FIG. 15 is a block diagram illustrating an application example of a storage device 2000 including a semiconductor memory device according to an embodiment of the present disclosure.

Referring to FIG. 15, the storage device 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 15, the plurality of groups communicate with the controller 2200 through first to k-th channels CH1 to CHk, respectively. Each semiconductor memory chip is configured and is operated similarly to one of the semiconductor memory device 100 described with reference to FIG. 1.

Each group is configured to communicate with the controller 2200 through one common channel. The controller 2200 is configured to control the plurality of memory chips of the semiconductor memory device 2100 through the plurality of channels CH1 to CHk.

In FIG. 15, the plurality of semiconductor memory chips are connected to one channel. However, it will be understood that the storage device 2000 may be modified so that one semiconductor memory chip is connected to one channel.

Figure 16:
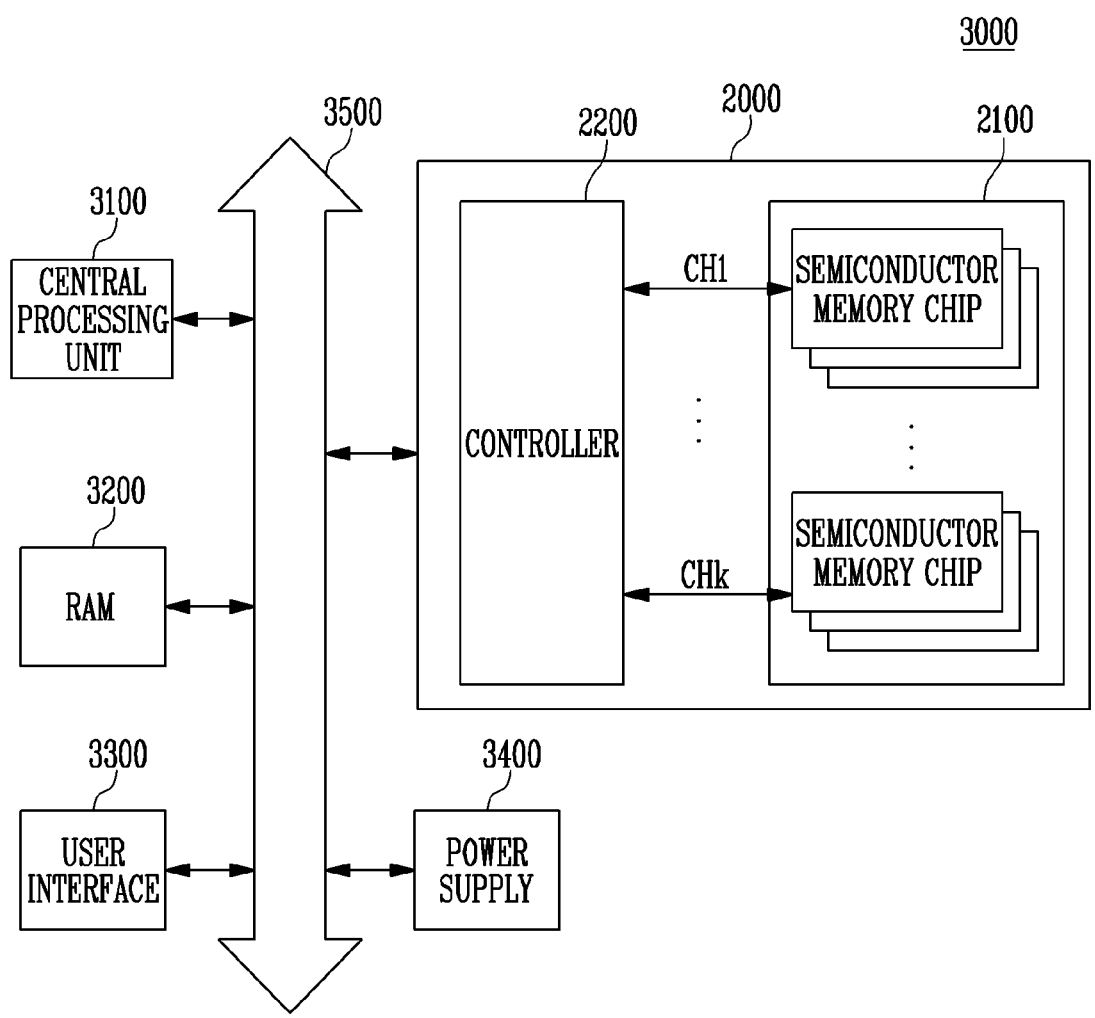
FIG. 16 is a block diagram illustrating a computing system including the storage device described with reference to FIG. 15.

FIG. 16 is a block diagram illustrating a computing system 3000 including the storage device described with reference to FIG. 15.

Referring to FIG. 16, the computing system 3000 includes a central processing unit 3100, random access memory (RAM) 3200, a user interface 3300, a power supply 3400, a system bus 3500, and the storage device 2000.

The storage device 2000 is electrically connected to the central processing unit 3100, the RAM 3200, the user interface 3300, and the power supply 3400 through the system bus 3500. Data provided through the user interface 3300 or processed by the central processing unit 3100 is stored in the storage device 2000.

In FIG. 16, the semiconductor memory chip 2100 is connected to the system bus 3500 through the controller 2200. However, the semiconductor memory device 2100 may be configured to be directly connected to the system bus 3500. At this time, a function of the controller 2200 is performed by the central processing unit 3100 and the RAM 3200.

What is claimed is:

1. A semiconductor memory device comprising:
a memory cell array including a plurality of memory cells;
a peripheral circuit configured to perform at least one of a read operation and a verify operation on selected memory cells among the plurality of memory cells; and
a control logic circuit configured to control the at least one of the read operation and the verify operation of the peripheral circuit,
wherein the control logic circuit is configured to control the peripheral circuit to apply a first voltage to a selected word line connected to the selected memory cells, float unselected word lines adjacent to the selected word line among unselected word lines, apply a first under-drive voltage lower than the first voltage to the selected word line during at least a partial period during which the unselected word lines adjacent to the selected word line are floated, and apply a second voltage higher than the first under-drive voltage and lower than the first voltage to the selected word line.

2. The semiconductor memory device of claim 1, wherein:
the first voltage is a read pass voltage, and
the second voltage is a first read voltage used for the read operation.

3. The semiconductor memory device of claim 2, wherein the control logic circuit is configured to control the peripheral circuit to apply the read pass voltage to the unselected word lines while the first voltage is applied to the selected word line.

4. The semiconductor memory device of claim 2, wherein the control logic circuit is configured to control the peripheral circuit to apply the read pass voltage to unselected word lines that are not adjacent to the selected word line while floating the unselected word lines adjacent to the selected word line.

5. The semiconductor memory device of claim 2, wherein the control logic circuit is configured to control the peripheral circuit to apply the read pass voltage to the unselected word lines while applying the second voltage higher than the first under-drive voltage and lower than the first voltage to the selected word line.

6. The semiconductor memory device of claim 2, wherein the control logic circuit is configured to control, after applying the first read voltage to the selected word line, the peripheral circuit to float the unselected word lines adjacent to the selected word line, apply a second under-drive voltage lower than the first read voltage to the selected word line while the unselected word lines adjacent to the selected word line are floated, and apply a second read voltage higher than the second under-drive voltage and lower than the first read voltage to the selected word line.

7. A method of operating a semiconductor memory device for performing at least one of a read operation and a verify operation on a plurality of memory cells, the method comprising:
applying a first voltage to a selected word line connected to selected memory cells among the plurality of memory cells and applying a read pass voltage to unselected word lines except for the selected word line;
floating unselected word lines adjacent to the selected word line among the unselected word lines; and
applying a first under-drive voltage lower than the first voltage to the selected word line during at least a partial period during which the unselected word lines adjacent to the selected word line are floated.

8. The method of claim 7, wherein the first voltage is the read pass voltage.

9. The method of claim 8, further comprising, after applying the first under-drive voltage to the selected word line:
applying the read pass voltage to the unselected word lines adjacent to the selected word line; and
applying a first read voltage higher than the first under-drive voltage and lower than the read pass voltage to the selected word line.

10. The method of claim 9, further comprising after applying the read pass voltage to the unselected word lines adjacent to the selected word line and applying the first read voltage to the selected word line:
floating the unselected word lines adjacent to the selected word line; and
applying a second under-drive voltage lower than the first read voltage to the selected word line.

11. The method of claim 7, wherein the first voltage is a first read voltage used for the read operation.

12. The method of claim 11, further comprising, after applying the first under-drive voltage to the selected word line:
applying the read pass voltage to the unselected word lines adjacent to the selected word line; and
applying a second read voltage higher than the first under-drive voltage and lower than the first read voltage to the selected word line.

13. A method of operating a semiconductor memory device for performing at least one of a read operation and a verify operation on a plurality of memory cells, the method comprising:

applying a first voltage to a selected word line, applying a first read pass voltage to unselected word lines that are not adjacent to the selected word line, and applying a second read pass voltage greater than the first read pass voltage to unselected word lines adjacent to the selected word line;

floating the unselected word lines adjacent to the selected word line among unselected word lines; and applying a first under-drive voltage lower than the first voltage to the selected word line during at least a partial period during which the unselected word lines adjacent to the selected word line are floated.

14. The method of claim 13, wherein the first voltage is the first read pass voltage.

15. The method of claim 14, further comprising, after applying the first under-drive voltage to the selected word line:

applying a third read pass voltage to the unselected word lines adjacent to the selected word line; and applying a first read voltage higher than the first under-drive voltage and lower than the first read pass voltage to the selected word line.

16. The method of claim 15, wherein the second read pass voltage is determined based on a difference between the first read pass voltage and the first under-drive voltage.

17. The method of claim 16, wherein the second read pass voltage is determined by the equation:

$$Vpass2 = Vpass1 + k1(Vpass1 - Vun1),$$

wherein Vpass1 is the first read pass voltage, Vpass2 is the second read pass voltage, Vun1 is the first under-drive voltage, and k1 is a positive number.

18. The method of claim 15, further comprising, after applying the third read pass voltage to the unselected word lines adjacent to the selected word line and applying the first read voltage to the selected word line:

floating the unselected word lines adjacent to the selected word line; and applying a second under-drive voltage lower than the first read voltage to the selected word line.

19. The method of claim 18, wherein the third read pass voltage is determined based on a difference between the first read voltage and the second under-drive voltage.

20. The method of claim 19, wherein the third read pass voltage is determined by the equation:

$$Vpass3 = Vpass1 + k2(R3 - Vun2),$$

wherein Vpass1 is the first read pass voltage, Vpass3 is the third read pass voltage, R3 is the first read voltage, Vun2 is the second under-drive voltage, and k2 is a positive number.

21. The method of claim 18, further comprising, after applying the second under-drive voltage to the selected word line:

applying a fourth read pass voltage to the unselected word lines adjacent to the selected word line; and applying a second read voltage lower than the first read voltage to the selected word line.

* * * * *